United States Patent
Newmeyer et al.

(10) Patent No.: US 12,157,849 B2
(45) Date of Patent: Dec. 3, 2024

(54) BLUE-EMITTING NANOCRYSTALS WITH CUBIC SHAPE AND GROUP IV METAL FLUORIDE PASSIVATION

(71) Applicant: Shoei Chemical Inc., Tokyo (JP)

(72) Inventors: Benjamin Newmeyer, San Jose, CA (US); Christian Ippen, Cupertino, CA (US); Jesse Manders, Mountain View, CA (US); Ruiqing Ma, Morristown, NJ (US); Dylan Charles Hamilton, Oakland, CA (US)

(73) Assignee: SHOEI CHEMICAL INC., Tokyo (JP)

( * ) Notice: Subject to any disclaimer, the term of this patent is extended or adjusted under 35 U.S.C. 154(b) by 561 days.

(21) Appl. No.: 17/190,621

(22) Filed: Mar. 3, 2021

(65) Prior Publication Data

US 2021/0277307 A1    Sep. 9, 2021

Related U.S. Application Data

(60) Provisional application No. 62/984,455, filed on Mar. 3, 2020.

(51) Int. Cl.
| | |
|---|---|
| *H10K 50/115* | (2023.01) |
| *C09K 11/02* | (2006.01) |
| *C09K 11/88* | (2006.01) |
| *H10K 85/10* | (2023.01) |
| *H10K 85/60* | (2023.01) |
| *B82Y 20/00* | (2011.01) |
| *B82Y 40/00* | (2011.01) |

(52) U.S. Cl.
CPC ............ *C09K 11/883* (2013.01); *C09K 11/02* (2013.01); *H10K 50/115* (2023.02); *H10K 85/1135* (2023.02); *H10K 85/633* (2023.02); *B82Y 20/00* (2013.01); *B82Y 40/00* (2013.01)

(58) Field of Classification Search
CPC . H10K 50/115; H10K 85/1135; H10K 85/633
See application file for complete search history.

(56) References Cited

U.S. PATENT DOCUMENTS

| | | |
|---|---|---|
| 10,074,770 B2 | 9/2018 | Park et al. |
| 2017/0066965 A1 | 3/2017 | Truskier et al. |

(Continued)

FOREIGN PATENT DOCUMENTS

| | | |
|---|---|---|
| EP | 2905321 A1 | 8/2015 |
| WO | WO-2021007494 A1 | 1/2021 |

OTHER PUBLICATIONS

Anderson, N.C., et al., "Ligand Exchange and the Stoichiometry of Metal Chalcogenide Nanocrystals: Spectroscopic Observation of Facile Metal-Carboxylate Displacement and Biding," *J. Am. Chem. Soc.*, 135(49):18536-18545, American Chemical Society, United States (2013).

(Continued)

*Primary Examiner* — Samuel A Gebremariam
(74) *Attorney, Agent, or Firm* — Alleman Hall & Tuttle LLP

(57) ABSTRACT

This disclosure pertains to the field of nanotechnology. The disclosure provides methods of preparing nanostructures using a Group IV metal halide. The nanostructures have high quantum yield, narrow emission peak width, tunable emission wavelength, and colloidal stability. Also provided are nanostructures prepared using the methods. And, nanostructure films and molded articles comprising the nanostructures are also provided.

16 Claims, 8 Drawing Sheets

(56) References Cited

U.S. PATENT DOCUMENTS

| | | |
|---|---|---|
| 2017/0306227 A1 | 10/2017 | Ippen et al. |
| 2018/0016495 A1 | 1/2018 | Kim et al. |
| 2018/0094190 A1 | 4/2018 | Kim et al. |
| 2018/0179441 A1 | 6/2018 | Park et al. |
| 2019/0006556 A1 | 1/2019 | Park et al. |
| 2019/0112527 A1 | 4/2019 | Moriyama et al. |
| 2019/0390109 A1 | 12/2019 | Ippen et al. |
| 2021/0009900 A1 | 1/2021 | Newmeyer et al. |

OTHER PUBLICATIONS

Ghosh, S., and Manna, L., "The Many "Facets" of Halide Ions in the Chemistry of Colloidal Inorganic Nanocrystals," *Chem Rev* 118(16):7804-7864, American Chemical Society, United States (Aug. 2018).

Li, X., et al., "Bright colloidal quantum dot light-emitting diodes enabled by efficient chlorination," *Nature Photonics* 12:159-164, Nature Publishing Group, United Kingdom (Feb. 2018).

Ning, J., et al., "Controlling Anisotropic Growth of Colloidal ZnSe Nanostructures," *Journal of the American Chemical Society* 140(44):14627-14637, American Chemical Society, United States (Aug. 2018).

BLUE-EMITTING NANOCRYSTALS WITH CUBIC SHAPE AND GROUP IV METAL FLUORIDE PASSIVATION

FIELD OF THE INVENTION

Field of the Invention

This disclosure pertains to the field of nanotechnology. The disclosure provides methods of preparing nanostructures using a Group IV metal fluoride. Also provided are nanostructures prepared using the methods. The nanostructures have high quantum yield, narrow emission peak width, tunable emission wavelength, and colloidal stability. And, nanostructure films and molded articles comprising the nanostructures are also provided.

Background Art

Semiconductor nanostructures can be incorporated into a variety of electronic and optical devices. The electrical and optical properties of such nanostructures vary, e.g., depending on their composition, shape, and size. For example, size-tunable properties of semiconductor nanoparticles are of great interest for applications such as light emitting diodes (LEDs) and liquid crystal displays (LCDs). Highly luminescent nanostructures are particularly desirable for such applications.

Steric bulk of long-chain alkyl ligands can result in insufficient ligand coverage on the surface of semiconductor nanocrystals due to packing limitation. Similarly, rounded particle surfaces exhibit steps, pits, and kinks that can be difficult to passivate with ligands. Such unpassivated sites on the surface of quantum dots can lead to mid-gap states that act as hole traps when an electric potential is applied across the quantum dots. Holes will accumulate at the HTL-QD interface leading to a rise in operating voltage and irreversible electrochemical degradation.

A need exists to produce nanostructures that have high quantum yield, narrow emission peak width, tunable emission wavelength, and colloidal stability.

BRIEF SUMMARY OF THE INVENTION

The present disclosure provides a nanostructure comprising a nanocrystal core and at least one shell, wherein at least one shell comprises at least one metal fluoride of formula (I):

wherein:
M=Zr, Hf, or Ti.

In some embodiment, the core comprises InP, InAs, ZnSe, ZnTe, or $ZnSe_{1-x}Te_x$, wherein $0 \leq x < 1$.

In some embodiments, the core comprises ZnSe or $ZnSe_{1-x}Te_x$, wherein $0 \leq x < 1$.

In some embodiments, at least one shell is selected from the group consisting of CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, and alloys thereof.

In some embodiments, at least one shell comprises ZnSe or ZnS.

In some embodiments, at least one metal fluoride is $HfF_4$ or $ZrF_4$.

In some embodiments, the molar ratio of at least one metal fluoride to zinc in the nanostructure is from about 1:1 to about 1:8.

In some embodiments, the nanostructure comprises:
(a) a core comprising ZnSe, at least one shell comprising ZnS, and at least one shell comprising $HfF_4$; or
(b) a core comprising $ZnSe_{1-x}Te_x$, wherein $0 \leq x < 1$, at least one shell comprising ZnSe, and at least one shell comprising ZnS, and at least one shell comprising $HfF_4$.

In some embodiments, the nanostructure is a quantum dot.

In some embodiments, the nanostructure exhibits a photoluminescence quantum yield of between about 60% and about 100%.

In some embodiments, the nanostructure exhibits a full width at half-maximum of between about 10 nm and about 40 nm.

In some embodiments, the nanostructure composition comprises:
(a) a nanostructure described herein; and
(b) at least one organic resin.

The present disclosure also provides a method of preparing the nanostructure comprising:
(a) providing a nanocrystal core;
(b) optionally admixing the core in (a) with a zinc source and a selenium source to provide a core with a ZnSe shell;
(c) admixing the core in (a) or the core with a ZnSe shell in (b) with a zinc source, a sulfur source, and at least one metal fluoride of formula (I):

wherein:
M=Zr, Hf, or Ti.
to provide the nanostructure.

In some embodiments, the core comprises InP, InAs, ZnSe, ZnTe, or $ZnSe_{1-x}Te_x$, wherein $0 \leq x < 1$.

In some embodiments, the core comprises ZnSe or $ZnSe_{1-x}Te_x$, wherein $0 \leq x < 1$.

In some embodiments, the zinc source in (b) is selected from the group consisting of diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof.

In some embodiments, the zinc source in (c) is selected from the group consisting of diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof.

In some embodiments, the selenium source in (b) is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and combinations thereof.

In some embodiments, the sulfur source in (c) is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and combinations thereof.

In some embodiments, the temperature in (b) is raised, lowered, or maintained to between about 200° C. and about 310° C.

In some embodiments, the temperature in (c) is raised, lowered, or maintained to between about 280° C. and about 310° C.

In some embodiments, the nanostructure exhibits a photoluminescence quantum yield of between about 60% and about 100%.

In some embodiments, the nanostructure has a full width at half-maximum of between about 10 nm and about 40 nm.

The present disclosure also provides an illumination device comprising:

(a) a first conductive layer;
(b) a second conductive layer; and
(c) an emitting layer, wherein the emitting layer comprises at least one population of nanostructures comprising a core and at least one shell, wherein at least one shell comprises a Group IV metal fluoride.

In some embodiments, the core of the nanostructures comprises InP, InAs, ZnSe, ZnTe, or $ZnSe_{1-x}Te_x$, wherein $0 \leq x < 1$.

In some embodiments, the core of the nanostructures comprises ZnSe or $ZnSe_{1-x}Te_x$, wherein $0 \leq x < 1$.

In some embodiments, the at least one shell of the nanostructures selected from the group consisting of CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, and alloys thereof.

In some embodiments, at least one shell of the nanostructures comprises ZnSe or ZnS.

In some embodiments, the at least one metal fluoride of the nanostructures is $HfF_4$ or $ZrF_4$.

In some embodiments, the device is stable for at least 7 days when stored at room temperature.

In some embodiments, the device is stable for at least 14 days when stored at room temperature.

In some embodiments, the illumination device further comprises an electron transport layer.

In some embodiments, the illumination device is a light emitting diode.

In some embodiments, the first conductive layer comprises indium tin oxide, indium zinc oxide, tin dioxide, zinc oxide, magnesium, aluminum, aluminum-lithium, calcium, magnesium-indium, magnesium-silver, silver, gold, or mixtures thereof.

In some embodiments, the first conductive layer comprises indium tin oxide.

In some embodiments, the second conductive layer comprises indium tin oxide, indium zinc oxide, titanium dioxide, tin oxide, zinc sulfide, silver, or mixtures thereof.

In some embodiments, the second conductive layer comprises aluminum.

In some embodiments, the second conductive layer comprises gold.

In some embodiments, the illumination device further comprises a semiconductor polymer layer.

In some embodiments, the semiconductor polymer layer comprises copper phthalocyanine, 4,4',4"-tris[(3-methylphenyl)phenylamino] triphenylamine (m-MTDATA), 4,4',4"-tris(diphenylamino) triphenylamine (TDATA), 4,4',4"-tris[2-naphthyl(phenyl)amino] triphenylamine (2T-NATA), polyaniline/dodecylbenzenesulfonic acid, poly(3,4-ethylenedioxythiophene)/polystyrene sulfonate) (PEDOT/PSS), polyaniline/camphor sulfonic acid, or polyaniline/poly(4-styrenesulfonate).

In some embodiments, the semiconductor polymer layer comprises PEDOT/PSS.

In some embodiments, the illumination device further comprises a first transport layer.

In some embodiments, the first transport layer comprises N,N'-di(naphthalen-1-yl)-N,N'-bis(4-vinylphenyl)-4,4'-diamine, poly[(9,9-dioctylfluorenyl-2,7-diyl)-co-(4,4'-(N-(4-sec-butylphenyl))diphenylamine)], or poly(9-vinylcarbazole).

In some embodiments, the first transport layer comprises N,N'-di(naphthalen-1-yl)-N,N'-bis(4-vinylphenyl)-4,4'-diamine.

DETAILED DESCRIPTION OF THE INVENTION

Definitions

Figure 1:
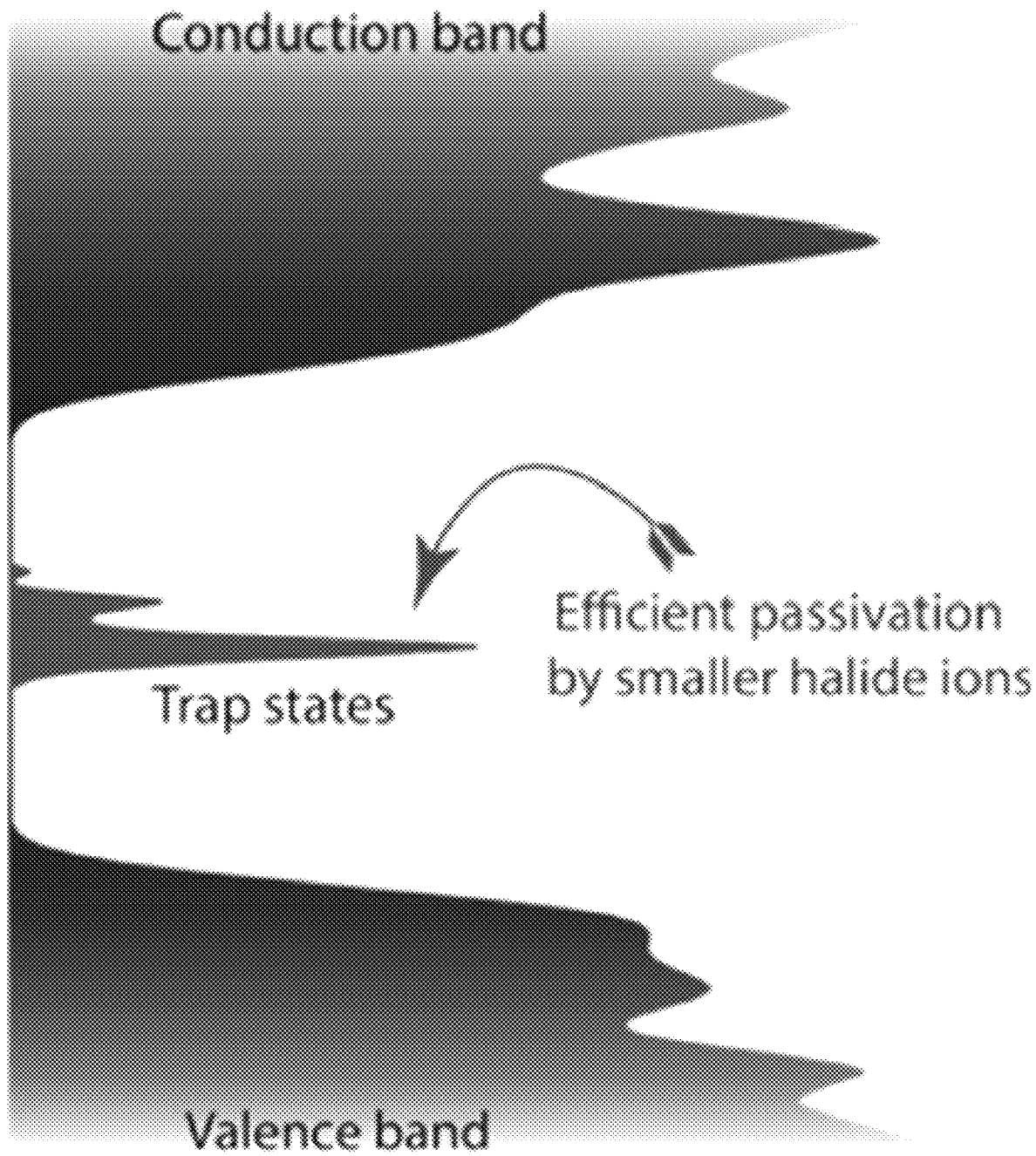
FIG. 1 is a density of states diagram describing the states that are available to be occupied by the system with the midgap trap states indicated as "trap states." Full surface coverage by halide ions can reduce the midgap trap states, forming a better electronically balanced quantum dot.
Figure 2:
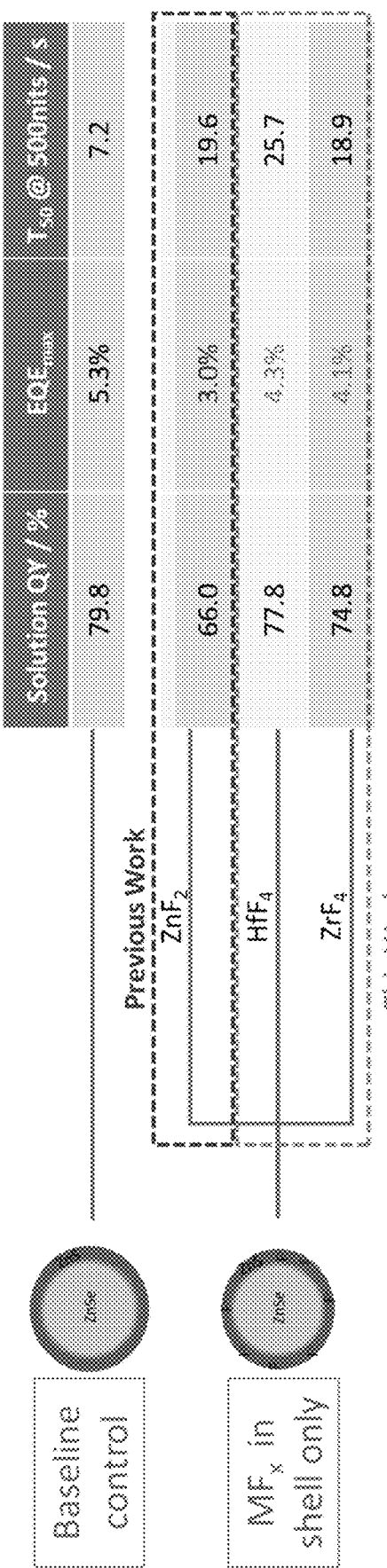
FIG. 2 is a table comparing solution quantum yield, maximum external quantum efficiency, and device lifetime for a control ZnSe quantum dot, a ZnSe quantum dot containing $ZnF_2$ in only the shell layer, a ZnSe quantum dot containing $HfF_4$ in only the shell layer, and a ZnSe quantum dot containing $ZrF_4$ in only the shell layer.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by ±10% of the value. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, nanotripods, nanobipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can, but need not, completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell can contain non-crystalline regions and can even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" (QY) is the ratio of photons emitted to photons absorbed, e.g., by a nanostructure or population of nanostructures. As known in the art, quantum yield is typically determined by a comparative method using well-characterized standard samples with known quantum yield values.

As used herein, the term "monolayer" is a measurement unit of shell thickness derived from the bulk crystal structure of the shell material as the closest distance between relevant lattice planes. By way of example, for cubic lattice structures the thickness of one monolayer is determined as the distance between adjacent lattice planes in the [111] direction. By way of example, one monolayer of cubic ZnSe corresponds to 0.33 nm and one monolayer of cubic ZnS corresponds to 0.31 nm thickness. The thickness of a monolayer of alloyed materials can be determined from the alloy composition through Vegard's law.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from TEM images of nanocrystals before and after a shell synthesis.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

"Peak emission wavelength" (PWL) is the wavelength where the radiometric emission spectrum of the light source reaches its maximum.

As used herein, the term "external quantum efficiency" (EQE) is a ratio of the number of photons emitted from a light emitting diode (LED) to the number of electrons passing through the device. The EQE measures how efficiently a LED converts electrons to photons and allows them to escape. EQE can be measured using the formula:

EQE=[injection efficiency]×[solid-state quantum yield]×[extraction efficiency]

where:
injection efficiency=the proportion of electrons passing through the device that are injected into the active region;

solid-state quantum yield=the proportion of all electron-hole recombinations in the active region that are radiative and thus, produce photons; and extraction efficiency=the proportion of photons generated in the active region that escape from the device.

Unless clearly indicated otherwise, ranges listed herein are inclusive.

A variety of additional terms are defined or otherwise characterized herein.

Core/shell nanoparticles are typically synthesized in a mixture of long alkyl chain compounds such as trioctylphosphine, lauric acid, and zinc oleate to ligate and passivate the surface of the quantum dot. However, due to limited packing density of alkyl chains, complete surface passivation cannot be achieved, and as such small ligands have been used for synergistic passivation. The present disclosure provides a method for incorporating a Group IV metal fluoride such as zirconium fluoride and/or hafnium fluoride into the shell growth reactions as a fluorine source, which results in better ligand coverage of the surface and passivation of hole traps created by dangling bonds. The resulting quantum dots are more stable in an electroluminescent device without severely compromising the maximum external quantum efficiency. The resultant quantum dots remain colloidally stable in nonpolar solvents such as octane that are preferred for the solution-processing of quantum dots into a electroluminescent device.

Nanostructure

In some embodiments, the present disclosure provides a nanostructure comprising a core and at least one shell, wherein at least one shell comprises a Group IV metal fluoride.

In some embodiments, the present disclosure provides a nanostructure comprising a core comprising zinc and at least one shell, wherein at least one shell comprises zinc and a Group IV metal halide.

In some embodiments, the nanostructure is a quantum dot.

Nanostructure Composition

In some embodiments, the present disclosure provides a nanostructure composition comprising:
(a) at least one population of nanostructures, the nanostructures comprising a core and at least one shell, wherein at least one shell comprises a Group IV metal fluoride; and
(b) at least one organic resin.

In some embodiments, the present disclosure provides a nanostructure composition comprising:
(a) at least one population of nanostructures, the nanostructures comprising a core comprising zinc and at least one shell, wherein at least one shell comprises zinc and a Group IV metal halide; and
(b) at least one organic resin.

In some embodiments, the nanostructure is a quantum dot.

Nanocrystal Core

In some embodiments, the nanostructure comprises an InP, InAs, ZnSe, ZnTe, or $ZnSe_{1-x}Te_x$ core. In some embodiments, the nanostructure comprises a ZnSe core and a ZnS shell. In some embodiments, the nanostructure comprises a $ZnSe_{1-x}Te_x$ core, a ZnSe shell, and a ZnS shell. In some embodiments, the nanostructure is a ZnSe/ZnS core/shell(s) nanostructure. In some embodiments, the nanostructure is a $ZnSe_{1-x}Te_x/ZnSe/ZnS$ core/shell(s) nanostructure.

As used herein, the term "nucleation phase" refers to the formation of a core nucleus. As used herein, the term "growth phase" refers to the growth process of adding additional inorganic material to a nanostructure.

The diameter of a nanocrystal core can be controlled by varying the amount of precursors provided. The diameter of a nanocrystal can be determined using techniques known to those of skill in the art. In some embodiments, the diameter of a nanocrystal core is determined using transmission electron microscopy (TEM).

In some embodiments, a nanocrystal core has a diameter of between about 1.0 nm and about 7.0 nm, about 1.0 nm and about 6.0 nm, about 1.0 nm and about 5.0 nm, about 1.0 nm and about 4.0 nm, about 1.0 nm and about 3.0 nm, about 1.0 nm and about 2.0 nm, about 2.0 nm and about 7.0 nm, about 2.0 nm and about 6.0 nm, about 2.0 nm and about 5.0 nm, about 2.0 nm and about 4.0 nm, about 2.0 nm and about 3.0 nm, about 3.0 nm and about 7.0 nm, about 3.0 nm and about 6.0 nm, about 3.0 nm and about 5.0 nm, about 3.0 nm and about 4.0 nm, about 4.0 nm and about 7.0 nm, about 4.0 nm and about 6.0 nm, about 4.0 nm and about 5.0 nm, about 5.0 nm and about 7.0 nm, about 5.0 nm and about 6.0 nm, or about 6.0 nm and about 7.0 nm. In some embodiments, a nanocrystal core has a diameter of between about 3.0 nm and about 6.0 nm.

In some embodiments, a nanocrystal core is doped with at least one metal ion or other element. Doping is the intentional introduction of an impurity into a nanostructure for the purpose of altering its optical, electrical, chemical, and/or magnetic properties. Yim, K., et al., *Scientific Reports* 7:40907 (January 2017). In doping, very small quantities of a metal ion are used resulting in only minor distortions of the lattice of the nanostructure. In some embodiments, the concentration of dopant is between about $10^{15}$ atoms/cm$^3$ and about $10^{20}$ atoms/cm$^3$.

In some embodiments, a nanocrystal core is doped with at least one metal ion or other element selected from the group consisting of lithium, boron, carbon, nitrogen, fluorine, sodium, aluminum, silicon, chlorine, potassium, scandium, selenium, titanium, vanadium, chromium, manganese, nickel, gallium, arsenic, palladium, gold, cadmium, indium, tin, antimony, lead, and combinations thereof. In some embodiments, a nanocrystal core is doped with at least one metal ion or other element selected from the group consisting of indium, gallium, aluminum, selenium, titanium, tin, chlorine, fluorine, and combinations thereof.

In some embodiments, a nanocrystal core is alloyed with at least one metal ion or other element. An alloy is a combination of at least two metals or a combination of at least one metal ion and at least one other element. In forming an alloy, large concentrations of a metal ion or other element are used resulting in properties that are often different from the pure material. In some embodiments, the concentration of metal ion or other element alloyed with is between about 0.1 wt % and about 50 wt %.

In some embodiments, a nanocrystal core is alloyed with at least one metal or other element selected from the group consisting of magnesium, cadmium, mercury, sulfur, tellurium, and selenium. In some embodiments, a ZnSe nanocrystal core is alloyed with tellurium.

In some embodiments, the core is purified before deposition of a shell. In some embodiments, the core is filtered to remove precipitate from the core solution.

In some embodiments, the core is subjected to an acid etching step before deposition of a shell.

In some embodiments, the diameter of the core is determined by measuring the lowest-energy electronic transition using absorbance spectroscopy and modeling the corresponding quantum dot size based on the principles of quantum confinement. Quantum confinement in zero-dimensional nanocrystallites, such as quantum dots, arises from the spatial confinement of electrons within the crystallite boundary. Quantum confinement can be observed once the diameter of the material is of the same magnitude as the de Broglie wavelength of the wave function. The electronic and optical properties of nanoparticles deviate substantially from those of bulk materials. A particle behaves as if it were free when the confining dimension is large compared to the wavelength of the particle. During this state, the band gap remains at its original energy due to a continuous energy state. However, as the confining dimension decreases and reaches a certain limit, typically in nanoscale, the energy spectrum becomes discrete. As a result, the band gap becomes size-dependent.

Nanostructure Shell Layers

The shell can, e.g., increase the quantum yield and/or stability of the nanostructures. In some embodiments, the core and the shell comprise different materials. In some embodiments, the nanostructure comprises shells of different shell material.

In some embodiments, a shell that comprises a mixture of Group II and VI elements is deposited onto a core or a core/shell(s) structure. In some embodiments, the shell is deposited by a mixture of at least two of a zinc source, a selenium source, a sulfur source, a tellurium source, and a cadmium source. In some embodiments, the shell is deposited by a mixture of two of a zinc source, a selenium source, a sulfur source, a tellurium source, and a cadmium source. In some embodiments, the shell is deposited by a mixture of three of a zinc source, a selenium source, a sulfur source, a tellurium source, and a cadmium source. In some embodiments, the shell is composed of zinc and sulfur; zinc and selenium; zinc, sulfur, and selenium; zinc and tellurium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium, zinc, and sulfur; cadmium, zinc, and selenium; or cadmium, zinc, sulfur, and selenium.

In some embodiments, the at least one shell comprises CdS, CdSe, CdO, CdTe, ZnS, ZnO, ZnSe, ZnTe, MgTe, GaAs, GaSb, GaN, HgO, HgS, HgSe, HgTe, InAs, InSb, InN, AlAs, AlN, AlSb, AlS, PbS, PbO, PbSe, PbTe, MgO, MgS, MgSe, MgTe, CuCl, Ge, Si, or alloys thereof. In some embodiments, the at least one shell comprises ZnSe. In some embodiments, the at least one shell comprises ZnS. In some embodiments, the at least one shell comprises a first shell comprising ZnSe and a second shell comprising ZnS.

In some embodiments, a shell comprises more than one monolayer of shell material. The number of monolayers is an average for all the nanostructures; therefore, the number of monolayers in a shell can be a fraction. In some embodiments, the number of monolayers in a shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the shell comprises between 3 and 5 monolayers.

The thickness of each shell can be determined using techniques known to those of skill in the art. In some embodiments, the thickness of each shell is determined by comparing the average diameter of the nanostructure before and after the addition of each shell. In some embodiments, the average diameter of the nanostructure before and after the addition of each shell is determined by TEM.

In some embodiments, each shell has a thickness of between about 0.05 nm and about 3.5 nm, about 0.05 nm and about 2 nm, about 0.05 nm and about 0.9 nm, about 0.05 nm and about 0.7 nm, about 0.05 nm and about 0.5 nm, about 0.05 nm and about 0.3 nm, about 0.05 nm and about 0.1 nm, about 0.1 nm and about 3.5 nm, about 0.1 nm and about 2 nm, about 0.1 nm and about 0.9 nm, about 0.1 nm and about 0.7 nm, about 0.1 nm and about 0.5 nm, about 0.1 nm and about 0.3 nm, about 0.3 nm and about 3.5 nm, about 0.3 nm and about 2 nm, about 0.3 nm and about 0.9 nm, about 0.3 nm and about 0.7 nm, about 0.3 nm and about 0.5 nm, about 0.5 nm and about 3.5 nm, about 0.5 nm and about 2 nm, about 0.5 nm and about 0.9 nm, about 0.5 nm and about 0.7 nm, about 0.7 nm and about 3.5 nm, about 0.7 nm and about 2 nm, about 0.7 nm and about 0.9 nm, about 0.9 nm and about 3.5 nm, about 0.9 nm and about 2 nm, or about 2 nm and about 3.5 nm.

Method of Preparing Nanostructures Comprising Group IV Fluoride Passivation in the Shell In some embodiments, the present disclosure provides a method of preparing a nanostructure comprising:
(a) providing a nanocrystal core;
(b) optionally admixing the core in (a) with a zinc source and a selenium source to provide a core with a ZnSe shell;
(c) admixing the core in (a) or the core with a ZnSe shell in (b) with a zinc source, a sulfur source, and a Group IV fluoride;
to provide the nanostructure.

In some embodiments, the present disclosure provides a method of preparing a nanostructure comprising:
(a) providing a nanocrystal core;
(b) admixing the core in (a) with a zinc source and a selenium source to provide a core with a ZnSe shell;
(c) admixing the core with a ZnSe shell in (b) with a zinc source, a sulfur source, and a Group IV fluoride;
to provide the nanostructure.

In some embodiments, the present disclosure provides a method of preparing a nanostructure comprising:
(a) providing a nanocrystal core;
(b) admixing the core in (a) with a zinc source, a sulfur source, and a Group IV fluoride;
to provide the nanostructure.

In some embodiments, the nanocrystal core comprises ZnSe, $ZnSe_{1-x}Te_x$, InP, or InAs. In some embodiments, the nanocrystal core comprises ZnSe. In some embodiments, the nanocrystal core comprises $ZnSe_{1-x}Te_x$.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc dioleate, zinc hexanoate, zinc octanoate, zinc laurate, zinc myristate, zinc palmitate, zinc stearate, zinc dithiocarbamate, or mixtures thereof. In some embodiments, the zinc source is zinc dioleate. In some embodiments, the zinc source is in situ produced zinc dioleate.

In some embodiments, the selenium source is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and combinations thereof. In some embodiments, the selenium source is tri(n-butyl)phosphine selenide, tri(sec-butyl) phosphine selenide, or tri(tert-butyl)phosphine selenide. In some embodiments, the selenium source is trioctylphosphine selenide.

In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and combinations thereof. In some embodiments, the sulfur source is an alkyl-substituted zinc dithiocarbamate. In some embodiments, the sulfur source is octanethiol. In some embodiments, the sulfur source is tributylphosphine sulfide.

In some embodiments, the molar ratio of nanocrystal core to zinc source is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the zinc source is zinc dioleate. In some embodiments, the zinc source is in situ prepared zinc dioleate. In some embodiments, the molar ratio of nanocrystal core to zinc dioleate is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000. In some embodiments, the molar ratio of nanocrystal core to zinc dioleate is between 1:2 and 1:50. In some embodiments, the molar ratio of nanocrystal core to zinc dioleate is between 1:20 and 1:30.

In some embodiments, the molar ratio of nanocrystal core to sulfur source is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the temperature of the reaction mixture after admixing the a zinc source and a selenium source is between 200° C. and 310° C., 200° C. and 280° C., 200° C. and 250° C., 200° C. and 220° C., 220° C. and 310° C., 220° C. and 280° C., 220° C. and 250° C., 250° C. and 310° C., 250° C. and 280° C., or 280° C. and 310° C. In some embodiments, the temperature of reaction mixture in (d) is between 250° C. and 310° C.

In some embodiments, the time to reach the temperature after admixing the a zinc source and a selenium source is between 2 and 240 minutes, between 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes.

In some embodiments, the temperature after admixing a zinc source and a selenium source is maintained for between 2 and 240 minutes, 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes. In some embodiments, after admixing the core or the core with a ZnSe shell with a zinc source, a sulfur source, and a Group IV fluoride, the temperature of the reaction mixture is maintained for between 30 and 120 minutes.

In some embodiments, the temperature after admixing the core or the core with a ZnSe shell with a zinc source, a sulfur source, and a Group IV fluoride is between 200° C. and 310° C., 200° C. and 280° C., 200° C. and 250° C., 200° C. and 220° C., 220° C. and 310° C., 220° C. and 280° C., 220° C. and 250° C., 250° C. and 310° C., 250° C. and 280° C., or 280° C. and 310° C. In some embodiments, the temperature in (f) is between 250° C. and 100° C.

In some embodiments, the time to reach the temperature after admixing the core or the core with a ZnSe shell with a zinc source, a sulfur source, and a Group IV fluoride is between 2 and 240 minutes, between 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes.

In some embodiments, the temperature after admixing the core or the core with a ZnSe shell with a zinc source, a sulfur source, and a Group IV fluoride is maintained for between 2 and 240 minutes, 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes.

In some embodiments, the number of monolayers in a ZnSe shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the ZnSe shell comprises between 2 and 6 monolayers. In some embodiments, the ZnSe shell comprises between 3 and 5 monolayers.

In some embodiments, a ZnSe monolayer has a thickness of about 0.328 nm.

In some embodiments, a ZnSe shell has a thickness of between 0.08 nm and 3.5 nm, 0.08 nm and 2 nm, 0.08 nm and 0.9 nm, 0.08 nm and 0.7 nm, 0.08 nm and 0.5 nm, 0.08 nm and 0.2 nm, 0.2 nm and 3.5 nm, 0.2 nm and 2 nm, 0.2 nm and 0.9 nm, 0.2 nm and 0.7 nm, 0.2 nm and 0.5 nm, 0.5 nm and 3.5 nm, 0.5 nm and 2 nm, 0.5 nm and 0.9 nm, 0.5 nm and 0.7 nm, 0.7 nm and 3.5 nm, 0.7 nm and 2 nm, 0.7 nm and 0.9 nm, 0.9 nm and 3.5 nm, 0.9 nm and 2 nm, or 2 nm and 3.5 nm.

In some embodiments, the number of monolayers in a ZnS shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the ZnS shell comprises between 2 and 12 monolayers. In some embodiments, the ZnS shell comprises between 4 and 6 monolayers.

In some embodiments, a ZnS monolayer has a thickness of about 0.31 nm.

In some embodiments, a ZnS shell has a thickness of between 0.08 nm and 3.5 nm, 0.08 nm and 2 nm, 0.08 nm and 0.9 nm, 0.08 nm and 0.7 nm, 0.08 nm and 0.5 nm, 0.08 nm and 0.2 nm, 0.2 nm and 3.5 nm, 0.2 nm and 2 nm, 0.2 nm and 0.9 nm, 0.2 nm and 0.7 nm, 0.2 nm and 0.5 nm, 0.5 nm and 3.5 nm, 0.5 nm and 2 nm, 0.5 nm and 0.9 nm, 0.5 nm and 0.7 nm, 0.7 nm and 3.5 nm, 0.7 nm and 2 nm, 0.7 nm and 0.9 nm, 0.9 nm and 3.5 nm, 0.9 nm and 2 nm, or 2 nm and 3.5 nm.

Group IV Metal Fluoride

The present disclosure provides a method of producing a nanostructure comprising a core comprising a nanocrystal and at least one shell disposed on the core, wherein at least one shell comprises at least one Group IV metal fluoride. In some embodiments, the nanostructure comprises a core comprising a nanocrystal and at least two shells disposed on the core, wherein at least one shell comprises at least one Group IV metal fluoride. In some embodiments, the nanostructure comprises a core comprising a nanocrystal and at least two shells disposed on the core, wherein at least two shells comprise at least one Group IV metal fluoride.

In some embodiments, the at least one shell comprises 1, 2, or 3 Group IV metal fluorides. In some embodiments, the at least one shell comprises 1 Group IV metal fluoride. In some embodiments, the at least one shell comprises 2 Group IV metal fluorides. In some embodiments, the at least one shell comprise 3 Group IV metal fluorides.

In some embodiments, the Group IV metal fluoride is of formula (I):

$$MF_4 \quad (I)$$

wherein:

M=Zr, Hf, or Ti.

In some embodiments, the Group IV metal fluoride is selected from the group consisting of $ZrF_4$, $HfF_4$, and $TiF_4$. In some embodiments, the Group IV metal fluoride is $ZrF_4$. In some embodiments, the Group IV metal fluoride is $HfF_4$.

Concentration of Group IV Metal Fluoride

The concentration of the at least one Group IV metal fluoride in the nanostructure can be determined by optical density (OD) measurement. OD can be measured at 450 nm using a 1 cm path length cuvette. For a 100 µL nanostructure with an $OD_{450}=1.5$, the concentration of the at least one Group IV metal fluoride in the solution is between about 0.01 mM and about 40 mM, about 0.01 mM and about 20 mM, about 0.01 mM and about 10 mM, about 0.01 mM and about 5 mM, about 0.01 mM and about 2.5 mM, about 0.01 mM and about 1.5 mM, about 0.01 mM and about 1 mM, about 0.01 mM and about 0.5 mM, about 0.01 mM and about 0.25 mM, about 0.25 mM and about 40 mM, about 0.25 mM and about 20 mM, about 0.25 mM and about 10 mM, about 0.25 mM and about 5 mM, about 0.25 mM and about 2.5 mM, about 0.25 mM and about 1.5 mM, about 0.25 mM and about 1.5 mM, about 0.25 mM and about 1 mM, about 0.25 mM and about 0.5 mM, about 0.25 mM and about 0.25 mM, about 0.5 mM and about 40 mM, about 0.5 mM and about 20 mM, about 0.5 mM and about 10 mM, about 0.5 mM and about 5 mM, about 0.5 mM and about 2.5 mM, about 0.5 mM and about 1.5 mM, about 0.5 mM and about 1 mM, about mM and about 40 mM, about 1 mM and about 20 mM, about 1 mM and about 10 mM, about 1 mM and about 5 mM, about 1 mM and about 2.5 mM, about 1 mM and about 1.5 mM, about 1.5 mM and about 40 mM, about 1.5 mM and about 20 mM, about 1.5 mM and about 10 mM, about 1.5 mM and about 5 mM, about 1.5 mM and about 2.5 mM, about 2.5 mM and about 40 mM, about 2.5 mM and about 20 mM, about 2.5 mM and about 10 mM, about 2.5 mM and about 5 mM, about 5 mM and about 40 mM, about 5 mM and about 20 mM, about 5 mM and about 10 mM, about 10 mM and about 40 mM, about 10 mM and about 20 mM, or about 20 mM and about 40 mM. For a 100 μL nanostructure with an $OD_{450}$=1.5, the concentration of the at least one metal fluoride is between about 1 mM and about 2.5 mM.

Ratio of Group IV Metal Fluoride to Core Comprising Zinc

In some embodiments, the molar ratio of the at least one Group IV metal fluoride to the core comprising zinc is between about 1:1 and about 8:1, about 1:1 and about 7:1, 1:1 and about 6:1, about 1:1 and about 5:1, about 1:1 and about 4:1, about 1:1 and about 3:1, about 1:1 and about 2:1, about 2:1 and about 8:1, about 2:1 and about 7:1, about 2:1 and about 6:1, about 2:1 and about 5:1, about 2:1 and about 4:1, about 2:1 and about 3:1, about 3:1 and about 8:1, about 3:1 and about 7:1, about 3:1 and about 6:1, about 3:1 and about 5:1, about 3:1 and about 4:1, about 4:1 and about 8:1, about 4:1 and about 7:1, about 4:1 and about 6:1, about 4:1 and about 5:1, about 5:1 and about 8:1, about 5:1 and about 7:1, about 5:1 and about 6:1, about 6:1 and about 8:1, about 6:1 and about 7:1, or about 7:1 and about 8:1. In some embodiments, the molar ratio of the at least one Group IV metal fluoride to zinc core is between about 1:1 and about 3:1.

Core/Shell(s) Nanostructures

In some embodiments, the core/shell(s) nanostructure is a ZnSe/ZnS nanostructure. In some embodiments, the core/shell(s) nanostructure is a $ZnSe_{1-x}Te_x$/ZnSe/ZnS nanostructure. In some embodiments, the core/shell(s) nanostructure is a ZnSe/ZnS nanostructure comprising $HfF_4$ in the ZnS shell. In some embodiments, the core/shell(s) nanostructure is a ZnSe/ZnS nanostructure comprising $ZrF_4$ in the ZnS shell. In some embodiments, the core/shell nanostructure is a $ZnSe_{1-x}Te_x$/ZnSe/ZnS nanostructure comprising $HfF_4$ in the ZnS shell.

Solvents

In some embodiments, the method of producing a nanostructure comprising zinc core and at least two shells, wherein at least two shells comprise zinc further comprises a solvent.

In some embodiments, the solvent is selected from the group consisting of chloroform, acetone, hexane, heptane, butanone, ethylene glycol monoethyl ether, ethylene glycol monopropyl ether, 1,4-butanediol diacetate, diethylene glycol monobutyl ether acetate, ethylene glycol monobutyl ether acetate, glyceryl triacetate, heptyl acetate, hexyl acetate, pentyl acetate, butyl acetate, ethyl acetate, diethylene glycol butyl methyl ether, diethylene glycol monobutyl ether, di(propylene glycol) dimethyl ether, diethylene glycol ethyl methyl ether, ethylene glycol monobutyl ether, diethylene glycol diethyl ether, methyl ethyl ketone, methyl isobutyl ketone, monomethyl ether glycol ester, gamma-butyrolactone, methylacetic-3-ethyl ether, butyl carbitol, butyl carbitol acetate, propanediol monomethyl ether, propanediol monomethyl ether acetate, cyclohexane, toluene, xylene, isopropyl alcohol, and combinations thereof. In some embodiments, the solvent is hexane, heptane, toluene, or chloroform.

Improved Properties of Nanostructures

In some embodiments, the core/shell(s) nanostructures prepared using the methods described herein display high photoluminescence quantum yield. In some embodiments, the core/shell(s) nanostructures can have a photoluminescence quantum yield of between 60% and 100%, between 60% and 95%, between 60% and 90%, between 60% and 85%, between 60% and 80%, between 60% and 70%, between 70% and 100%, between 70% and 95%, between 70% and 90%, between 70% and 85%, between 70% and 80%, between 80% and 100%, between 80% and 95%, between 80% to 90%, between 80% and 85%, between 85% and 100%, between 85% and 95%, between 80% and 85%, between 85% and 100%, between 85% and 90%, between 90% and 100%, between 90% and 95%, or between 95% and 100%. In some embodiments, the core/shell(s) nanostructures prepared using the methods described herein have a photoluminescence quantum yield of between 60% and 80%.

The photoluminescence spectrum of the core/shell(s) nanostructures prepared using the methods described herein can cover essentially any desired portion of the spectrum. In some embodiments, the photoluminescence spectrum for the core/shell(s) nanostructures have a emission maximum between 300 nm and 750 nm, between 300 nm and 650 nm, between 300 nm and 550 nm, between 300 nm and 450 nm, between 450 nm and 750 nm, between 450 nm and 650 nm, between 450 nm and 550 nm, between 450 nm and 750 nm, between 450 nm and 650 nm, between 450 nm and 550 nm, between 550 nm and 750 nm, between 550 nm and 650 nm, or between 650 nm and 750 nm. In some embodiments, the photoluminescence spectrum for the core/shell(s) nanostructures have an emission maximum of between 500 nm and 550 nm. In some embodiments, the photoluminescence spectrum for the core/shell(s) nanostructures prepared using the methods described herein have an emission maximum of between 430 nm and 460 nm.

The size distribution of the core/shell(s) nanostructures prepared using the methods described herein can be relatively narrow. In some embodiments, the photoluminescence spectrum of the population or core/shell(s) nanostructures prepared using the methods described herein have a full width at half maximum of between 10 nm and 60 nm, between 10 nm and 40 nm, between 10 nm and 30 nm, between 10 nm and 20 nm, between 20 nm and 60 nm, between 20 nm and 40 nm, between 20 nm and 30 nm, between 30 nm and 60 nm, between 30 nm and 40 nm, or between 40 nm and 60 nm. In some embodiments, the photoluminescence spectrum of the population or core/shell(s) nanostructures prepared using the methods described herein have a full width at half maximum of between 10 nm and 40 nm.

In some embodiments, the nanostructures of the present invention have a cubic shape. The shape of the nanostructures can be determined by visual inspection. In some embodiments, the cubic shape of the nanostructures is observed by visual inspection of a TEM image.

In some embodiments, a population of nanostructures that has a cubic shape is a population where at least 75%, at least 80%, at least 85%, at least 90%, or at least 95% of the nanostructures have a cubic shape. In some embodiments, a population of nanostructures that has a cubic shape is a population where at least 85% of the nanostructures have a cubic shape.

Nanostructure Film

In some embodiments, the core/shell(s) nanostructures prepared by the method described herein are incorporated into a nanostructure film. In some embodiments, the nanostructure film is incorporated into a quantum dot enhancement film (QDEF).

In some embodiments, the present disclosure provides a nanostructure film comprising:
 (a) at least one population of nanostructures, the nanostructures comprising a core and at least one shell, wherein at least one shell comprises a Group IV metal fluoride; and
 (b) at least one organic resin.

In some embodiments, the nanostructure is a quantum dot.

In some embodiments, the present disclosure provides a nanostructure film comprising:
 (a) at least one population of nanostructures, the nanostructures comprising a core comprising zinc and at least one shell, wherein at least one shell comprises zinc and a Group IV metal fluoride; and
 (b) at least one organic resin.

In some embodiments, the nanostructure is a quantum dot.

In some embodiments, the core/shell(s) nanostructures are embedded in a matrix. As used herein, the term "embedded" is used to indicate that the nanostructures are enclosed or encased within a matrix material that makes up the majority component of the matrix. In some embodiments, the nanostructures are uniformly distributed throughout the matrix material. In some embodiments, the nanostructures are distributed according to an application-specific uniformity distribution function.

In some embodiments, the nanostructures can include a homogenous population having sizes that emit in the blue visible wavelength spectrum, in the green visible wavelength spectrum, or in the red visible wavelength spectrum. In some embodiments, the nanostructures can include a first population of nanostructures having sizes that emit in the blue visible wavelength spectrum, a second population of nanostructures having sizes that emit in the green visible wavelength spectrum, and a third population of nanostructures having sizes that emit in the red visible wavelength spectrum.

The matrix material can be any suitable host matrix material capable of housing nanostructures. Suitable matrix materials can be chemically and optically compatible with nanostructures and any surrounding packaging materials or layers used in applying a nanostructure film to devices. Suitable matrix materials can include non-yellowing optical materials that are transparent to both the primary and secondary light, thereby allowing for both primary and secondary light to transmit through the matrix material. Matrix materials can include polymers and organic and inorganic oxides. Suitable polymers for use in the matrix material can be any polymer known to the ordinarily skilled artisan that can be used for such a purpose. The polymer can be substantially translucent or substantially transparent. Matrix materials can include, but not limited to, epoxies, acrylates, norbornene, polyethylene, poly(vinyl butyral): poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are cross-linked with bifunctional monomers, such as divinylbenzene; cross-linkers suitable for cross-linking ligand materials, epoxides that combine with ligand amines (e.g., APS or polyethylene imine ligand amines) to form epoxy, and the like.

In some embodiments, the matrix material includes scattering microbeads such as $TiO_2$ microbeads, ZnS microbeads, or glass microbeads that can improve photo conversion efficiency of the nanostructure film. In some embodiments, the matrix material can include light blocking elements.

In some embodiments, the matrix material can have low oxygen and moisture permeability, exhibit high photo- and chemical-stability, exhibit favorable refractive indices, and adhere to outer surfaces of the nanostructures, thus providing an air-tight seal to protect the nanostructures. In another embodiment, the matrix material can be curable with UV or thermal curing methods to facilitate roll-to-roll processing.

In some embodiments, a nanostructure film can be formed by mixing nanostructures in a polymer (e.g., photoresist) and casting the nanostructure-polymer mixture on a substrate, mixing the nanostructures with monomers and polymerizing them together, mixing nanostructures in a sol-gel to form an oxide, or any other method known to those skilled in the art.

In some embodiments, the formation of a nanostructure film can include a film extrusion process. The film extrusion process can include forming a homogenous mixture of matrix material and barrier layer coated core/shell nanostructures such as nanostructures functionalized with a Group IV metal fluoride, introducing the homogenous mixture into a top mounted hopper that feeds into an extruder. In some embodiments, the homogenous mixture can be in the form of pellets. The film extrusion process can further include extruding a nanostructure film from a slot die and passing an extruded nanostructure film through chill rolls. In some embodiments, the extruded nanostructure film can have a thickness less than about 75 μm, for example, in a range from about 70 μm to about 40 μm, about 65 μm to about 40 μm, about 60 μm to about 40 μm, or about 50 μm to about 40 μm. In some embodiments, the nanostructure film has a thickness less than about 10 μm. In some embodiments, the formation of the nanostructure film can optionally include a secondary process followed by the film extrusion process. The secondary process can include a process such as co-extrusion, thermoforming, vacuum forming, plasma treatment, molding, and/or embossing to provide a texture to a top surface of the nanostructure film layer. The textured top surface nanostructure film can help to improve, for example defined optical diffusion property and/or defined angular optical emission property of the nanostructure film.

Quantum Dot on Glass LCD Display Device

In some embodiments, the nanostructure film is incorporated into a quantum dot on glass LCD display device. A LCD display device can include a nanostructure film formed directly on a light guide plate (LGP) without necessitating an intermediate substrate or barrier layer. In some embodiments, a nanostructure film can be a thin film. In some embodiments, a nanostructure film can have a thickness of 500 µm or less, 100 µm or less, or 50 µm or less. In some embodiments, a nanostructure film is a thin film having a thickness of about 15 µm or less.

A LGP can include an optical cavity having one or more sides, including at least a top side, comprising glass. Glass provides excellent resistance to impurities including moisture and air. Moreover, glass can be formed as a thin substrate while maintaining structural rigidity. Therefore, a LGP can be formed at least partially of a glass surface to provide a substrate having sufficient barrier and structural properties.

In some embodiments, a nanostructure film can be formed on a LGP. In some embodiments, the nanostructure film comprises a population of nanostructures embedded in a matrix material, such as a resin. A nanostructure film can be formed on a LGP by any method known in the art, such as wet coating, painting, spin coating, or screen printing. After deposition, a resin of a nanostructure film can be cured. In some embodiments a resin of one or more nanostructure films can be partially cured, further processed and then finally cured. The nanostructure films can be deposited as one layer or as separate layers, and the separate layers can comprise varying properties. The width and height of the nanostructure films can be any desired dimensions, depending on the size of the viewing panel of the display device. For example, the nanostructure films can have a relatively small surface area in small display device embodiments such as watches and phones, or the nanostructure films can have a large surface area for large display device embodiments such as TVs and computer monitors.

In some embodiments, an optically transparent substrate is formed on a nanostructure film by any method known in the art, such as vacuum deposition, vapor deposition, or the like. An optically transparent substrate can be configured to provide environmental sealing to the underlying layers and/or structures of the nanostructure film. In some embodiments, light blocking elements can be included in the optically transparent substrate. In some embodiments, light blocking elements can be included in a second polarizing filter, which can be positioned between the substrate and the nanostructure film. In some embodiments, light blocking elements can be dichroic filters that, for example, can reflect the primary light (e.g., blue light, UV light, or combination of UV light and blue light) while transmitting the secondary light. Light blocking elements can include specific UV light filtering components to remove any unconverted UV light from the red and green sub-pixels, and/or the UV light from the blue sub-pixels.

On-Chip and Near Chip Placement of Quantum Dots

In some embodiments, the nanostructures are incorporated into display devices by "on-chip" placements. As used herein, "on-chip" refers to placing nanostructures into an LED cup. In some embodiments, the nanostructures are dissolved in a resin or a fluid to fill the LED cup.

In some embodiments, the nanostructures are incorporated into display devices by "near-chip" placements. As used herein, "near-chip" refers to coating the top surface of the LED assembly with nanostructures such that the outgoing light passes through the nanostructure film.

Display Device with Nanostructure Color Conversion Layer

In some embodiments, the present invention provides a display device comprising:
(a) a display panel to emit a first light;
(b) a backlight unit configured to provide the first light to the display panel; and
(c) a color filter comprising at least one pixel region comprising a color conversion layer.

In some embodiments, the color filter comprises at least 1, 2, 3, 4, 5, 6, 7, 8, 9, or 10 pixel regions. In some embodiments, when blue light is incident on the color filter, red light, white light, green light, and/or blue light may be respectively emitted through the pixel regions. In some embodiments, the color filter is described in U.S. Patent Appl. Publication No. 2017/153366, which is incorporated herein by reference in its entirety.

In some embodiments, each pixel region includes a color conversion layer. In some embodiments, a color conversion layer comprises nanostructures described herein configured to convert incident light into light of a first color. In some embodiments, the color conversion layer comprises nanostructures described herein configured to convert incident light into blue light.

In some embodiments, the display device comprises 1, 2, 3, 4, 5, 6, 7, 8, 9, or 10 color conversion layers. In some embodiments, the display device comprises 1 color conversion layer comprising the nanostructures described herein. In some embodiments, the display device comprises 2 color conversion layers comprising the nanostructures described herein. In some embodiments, the display device comprises 3 color conversion layers comprising the nanostructures described herein. In some embodiments, the display device comprises 4 color conversion layers comprising the nanostructures described herein. In some embodiments, the display device comprises at least one red color conversion layer, at least one green color conversion layer, and at least one blue color conversion layer.

In some embodiments, the color conversion layer has a thickness between about 3 µm and about 10 µm, about 3 µm and about 8 µm, about 3 µm and about 6 µm, about 6 µm and about 10 µm, about 6 µm and about 8 µm, or about 8 µm and about 10 µm. In some embodiments, the color conversion layer has a thickness between about 3 µm and about 10 µm.

The nanostructure color conversion layer can be deposited by any suitable method known in the art, including but not limited to painting, spray coating, solvent spraying, wet coating, adhesive coating, spin coating, tape-coating, roll coating, flow coating, inkjet printing, photoresist patterning, drop casting, blade coating, mist deposition, or a combination thereof. In some embodiments, the nanostructure color conversion layer is deposited by photoresist patterning. In some embodiments, nanostructure color conversion layer is deposited by inkjet printing.

Inkjet Printing

The formation of thin films using dispersions of nanostructures in organic solvents is often achieved by coating techniques such as spin coating. However, these coating techniques are generally not suitable for the formation of thin films over a large area and do not provide a means to pattern the deposited layer and thus, are of limited use. Inkjet printing allows for precisely patterned placement of thin films on a large scale at low cost. Inkjet printing also allows for precise patterning of nanostructure layers, allows printing pixels of a display, and eliminates photopatterning. Thus, inkjet printing is very attractive for industrial application—particularly in display applications.

Solvents commonly used for inkjet printing are dipropylene glycol monomethyl ether acetate (DPMA), polyglycidyl methacrylate (PGMA), diethylene glycol monoethyl ether acetate (EDGAC), and propylene glycol methyl ether acetate (PGMEA). Volatile solvents are also frequently used in inkjet printing because they allow rapid drying. Volatile solvents include ethanol, methanol, 1-propanol, 2-propanol, acetone, methyl ethyl ketone, methyl isobutyl ketone, ethyl acetate, and tetrahydrofuran. Conventional nanostructures generally cannot be dissolved in these solvents. However, the increased hydrophilicity of the nanostructures comprising poly(alkylene oxide) ligands allows for increased solubility in these solvents.

In some embodiments, the nanostructures described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, chloroform, chlorobenzene, cyclohexane, hexane, heptane, octane, hexadecane, undecane, decane, dodecane, xylene, toluene, benzene, octadecane, tetradecane, butyl ether, or combinations thereof. In some embodiments, the nanostructures comprising a poly(alkylene oxide) ligands described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, or combinations thereof.

In order to be applied by inkjet printing or microdispensing, the inkjet compositions comprising nanostructures should be dissolved in a suitable solvent. The solvent must be able to disperse the nanostructure composition and must not have any detrimental effect on the chosen print head.

In some embodiments, the inkjet composition further comprises one or more additional components such as surface-active compounds, lubricating agents, wetting agents, dispersing agents, hydrophobing agents, adhesive agents, flow improvers, defoaming agents, deaerators, diluents, auxiliaries, colorants, dyes, pigments, sensitizers, stabilizers, and inhibitors.

In some embodiments, the nanostructure compositions described herein comprise by weight of the inkjet composition between about 0.01% and about 20%. In some embodiments, the nanostructures comprising poly(alkylene oxide) ligands comprise by weight of the inkjet composition between about 0.01% and about 20%, about 0.01% and about 15%, about 0.01% and about 10%, about 0.01% and about 5%, about 0.01% and about 2%, about 0.01% and about 1%, about 0.01% and about 0.1%, about 0.01% and about 0.05%, about 0.05% and about 20%, about 0.05% and about 15%, about 0.05% and about 10%, about 0.05% and about 5%, about 0.05% and about 2%, about 0.05% and about 1%, about 0.05% and about 0.1%, about 0.1% and about 20%, about 0.1% and about 15%, about 0.1% and about 10%, about 0.1% and about 5%, about 0.1% and about 2%, about 0.1% and about 1%, about 0.5% and about 20%, about 0.5% and about 15%, about 0.5% and about 10%, about 0.5% and about 5%, about 0.5% and about 2%, about 0.5% and about 1%, about 1% and about 20%, about 1% and about 15%, about 1% and about 10%, about 1% and about 5%, about 1% and about 2%, about 2% and about 20%, about 2% and about 15%, about 2% and about 10%, about 2% and about 5%, about 5% and about 20%, about 5% and about 15%, about 5% and about 10%, about 10% and about 20%, about 10% and about 15%, or about 15% and 20%.

In some embodiments, the inkjet composition comprising a nanostructure or a nanostructure composition described herein is used in the formulation of an electronic device. In some embodiments, the inkjet composition comprising a nanostructure or a nanostructure composition described herein is used in the formulation of an electronic device selected from the group consisting of a nanostructure film, a display device, a lighting device, a backlight unit, a color filter, a surface light-emitting device, an electrode, a magnetic memory device, and a battery. In some embodiments, the inkjet composition comprising a nanostructure composition described herein is used in the formulation of a light-emitting device.

Illumination Devices

In some embodiments, the nanoparticles comprising zinc oxide can be used in the electron transport layer of an illumination device.

The illumination device can be used in a wide variety of applications, such as flexible electronics, touchscreens, monitors, televisions, cellphones, and any other high definition displays. In some embodiments, the illumination device is a light emitting diode. In some embodiments, the illumination device is a quantum dot light emitting diode (QD-LED). An example of a QD-LED is disclosed in U.S. patent application Ser. No. 15/824,701, which is incorporated herein by reference in its entirety.

In some embodiments, the present disclosure provides an illumination device comprising:
(a) a first conductive layer;
(b) a second conductive layer; and
(c) an emitting layer, wherein the emitting layer comprises at least one population of nanoparticles comprising a core and at least one shell disposed on the core, wherein at least one shell comprises zinc and a Group IV metal fluoride.

In some embodiments, the illumination device comprises:
(a) a first conductive layer;
(b) a second conductive layer;
(c) an electron transport layer, wherein the electron transport layer comprises at least one population of nanostructures;
(d) an emitting layer, wherein the emitting layer comprises at least one population of nanoparticles comprising a core comprising zinc and at least one shell, wherein at least one shell comprises zinc and a Group IV metal fluoride.

In some embodiments, the nanostructures are quantum dots.

In some embodiments, the illumination device comprises a first conductive layer, a second conductive layer, and an electron transport layer, wherein the electron transport layer is arranged between the first conductive layer and the second conductive layer. In some embodiments, the electron transport layer is a thin film.

In some embodiments, the illumination device comprises additional layers between the first conductive layer and the second conductive layer such as a hole injection layer, a hole transport layer, an electron transport layer, and an emitting layer. In some embodiments, the hole injection layer, the hole transport layer, the electron transport layer, and the emitting layer are thin films. In some embodiments, the layers are stacked on a substrate.

When voltage is applied to the first conductive layer and the second conductive layer, holes injected at the first conductive layer move to the emitting layer via the hole injection layer and/or the hole transport layer, and electrons injected from the second conductive layer move to the emitting layer via the electron transport layer. The holes and electrons recombine in the emitting layer to generate excitons.

Substrate

The substrate can be any substrate that is commonly used in the manufacture of illumination devices. In some embodiments, the substrate is a transparent substrate, such as glass. In some embodiments, the substrate is a flexible material such as polyimide, or a flexible and transparent material such as polyethylene terephthalate. In some embodiments, the substrate has a thickness of between about 0.1 mm and about 2 mm. In some embodiments, the substrate is a glass substrate, a plastic substrate, a metal substrate, or a silicon substrate.

First Conductive Layer

In some embodiments, a first conductive layer is disposed on the substrate. In some embodiments, the first conductive layer is a stack of conductive layers. In some embodiments, the first conductive layer has a thickness between about 50 nm and about 250 nm. In some embodiments, the first conductive layer is deposited as a thin film using any known deposition technique, such as, for example, sputtering or electron-beam evaporation. In some embodiments, the first conductive layer comprises indium tin oxide (ITO), indium zinc oxide (IZO), tin dioxide ($SnO_2$), zinc oxide (ZnO), magnesium (Mg), aluminum (Al), aluminum-lithium (Al—Li), calcium (Ca), magnesium-indium (Mg—In), magnesium-silver (Mg—Ag), silver (Ag), gold (Au), or mixtures thereof. In some embodiments, the first conductive layer is an anode.

Second Conductive Layer

In some embodiments, additional layers can be sandwiched between a first conductive layer and a second conductive layer. In some embodiments, the first conductive layer acts as the anode of the device while the second conductive layer acts as the cathode of the device. In some embodiments, the second conductive layer is a metal, such as aluminum. In some embodiments, the second conductive layer has a thickness between about 100 nm and about 150 nm. In some embodiments, the second conductive layer represents a stack of conductive layers. For example, a second conductive layer can include a layer of silver sandwiched between two layers of ITO (ITO/Ag/ITO).

In some embodiments, the second conductive layer comprises indium tin oxide (ITO), an alloy of indium oxide and zinc (IZO), titanium dioxide, tin oxide, zinc sulfide, silver (Ag), or mixtures thereof.

Semiconductor Polymer Layer

In some embodiments, the illumination device further comprises a semiconductor polymer layer. In some embodiments, the semiconductor polymer layer acts as a hole injection layer. In some embodiments, the semiconductor polymer layer is deposited on the first conductive layer. In some embodiments, the semiconductor polymer layer is deposited by vacuum deposition, spin-coating, printing, casting, slot-die coating, or Langmuir-Blodgett (LB) deposition. In some embodiments, the semiconductor polymer layer has a thickness between about 20 nm and about 60 nm.

In some embodiments, the semiconductor polymer layer comprises copper phthalocyanine, 4,4',4"-tris[(3-methylphenyl)phenylamino] triphenylamine (m-MTDATA), 4,4',4"-tris(diphenylamino) triphenylamine (TDATA), 4,4',4"-tris [2-naphthyl(phenyl)amino] triphenylamine (2T-NATA), polyaniline/dodecylbenzenesulfonic acid, poly(3,4-ethylenedioxythiophene)/polystyrene sulfonate) (PEDOT/PSS), polyaniline/camphor sulfonic acid, or polyaniline/poly(4-styrenesulfonate).

First Transport Layer

In some embodiments, the illumination device further comprises transport layers to facilitate the transport of electrons and holes affected by the generated electric field between the first conductive layer and the second conductive layer. In some embodiments, the illumination device further comprises a first transport layer associated with the first conductive layer. In some embodiments, the first transport layer acts as a hole transport layer (and an electron and/or exciton blocking layer). In some embodiments, the first transport layer is deposited on the first conductive layer. In some embodiments, the first transport layer is deposited on the semiconductor polymer layer. In some embodiments, the first transport layer has a thickness between about 20 nm and about 50 nm. In some embodiments, the first transport layer is substantially transparent to visible light.

In some embodiments, the first transport layer comprises a material selected from the group consisting of an amine, a triarylamine, a thiophene, a carbazole, a phthalocyanine, a porphyrin, or a mixture thereof. In some embodiments, the first transport layer comprises N,N'-di(naphthalen-1-yl)-N,N'-bis(4-vinylphenyl)-4,4'-diamine, poly[(9,9-dioctylfluorenyl-2,7-diyl)-co-(4,4'-(N-(4-sec-butylphenyl))diphenylamine)], and poly(9-vinylcarbazole).

Second Transport Layer

In some embodiments, the illumination device further comprises a second transport layer. In some embodiments, the second transport layer acts as an electron transport layer (and a hole and/or exciton blocking layer). In some embodiments, the second transport layer contacts the emitting layer. In some embodiments, the second transport layer is arranged between the emitting layer and the second conductive layer. In some embodiments, the second transport layer has a thickness between about 20 nm and about 50 nm. In some embodiments, the second transport layer is substantially transparent to visible light.

In some embodiments, the second transport layer is an electron transport layer.

The roles of the first transport layer and the second transport layer are reversed when the polarity of the first conductive layer and the second conductive layer are reversed.

Electron Transport Layer

In some embodiments, the illumination device comprises at least one electron transport layer. In some embodiments, the illumination device is a quantum dot light emitting diode.

In some embodiments, the electron transport layer has a thickness between about 20 nm and about 50 nm. In some embodiments, the electron transport layer has a thickness between about 20 nm and about 50 nm, about 20 nm and about 40 nm, about 20 nm and about 30 nm, about 30 nm and about 50 nm, about 30 nm and about 40 nm, or about 40 nm and about 50 nm.

In some embodiments, the electron transport layer comprises zinc oxide. In some embodiments, the electron transport layer comprises zinc magnesium oxide.

Illumination Devices with Improved Properties

In some embodiments, an illumination device prepared using the nanostructures of the present disclosure shows an EQE of between about 1.5% and about 20%, about 1.5% and about 15%, about 1.5% and about 12%, about 1.5% and about 10%, about 1.5% and about 8%, about 1.5% and about 4%, about 1.5% and about 3%, about 3% and about 20%, about 3% and about 15%, about 3% and about 12%, about 3% and about 10%, about 3% and about 8%, about 8% and about 20%, about 8% and about 15%, about 8% and about 12%, about 8% and about 10%, about 10% and about 20%, about 10% and about 15%, about 10% and about 12%, about 12% and about 20%, about 12% and about 15%, or about 15% and about 20%. In some embodiments, an illumination device prepared using the nanostructures of the present disclosure shows an EQE of between about 2% and about 6%. In some embodiments, the illumination device is a light emitting diode.

In some embodiments, an illumination device prepared using the nanostructures of the present disclosure shows an improved lifetime. In some embodiments, an illumination device prepared using the nanostructures of the present disclosure reaches 50% of initial luminance of 500 nits (cd/m$^2$) (T$_{50}$) in between about 1 second and about 100 seconds, about 1 second and about 60 seconds, about 1 second and about 40 seconds, about 1 second and about 30 seconds, about 1 second and about 20 seconds, about 1 second and about 10 seconds, about 10 seconds and about 100 seconds, about 10 seconds and about 60 seconds, about 10 seconds and about 40 seconds, about 10 seconds and about 30 seconds, about 10 seconds and about 20 seconds, about 20 seconds and about 100 seconds, about 20 seconds and about 50 seconds, about 20 seconds and about 40 seconds, about 20 seconds and about 30 seconds, about 30 seconds and about 40 seconds, about 40 seconds and about 100 seconds, about 40 seconds and about 60 seconds, or about 60 seconds and about 100 seconds. In some embodiments, an illumination device prepared using the nanostructures of the present disclosure reaches 50% of initial luminance of 500 nits (cd/m$^2$) (T$_{50}$) in between about 20 seconds and about 60 seconds.

EXAMPLES

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

Example 1

Synthesis of ZnSe$_{1-x}$Te$_x$ Nanocrystals Using TOPTe Precursor

Preparation of TOPTe precursor: the Te precursor mixture was prepared by first diluting trioctylphosphine telluride (1 M Te, 230 µL) with 2.5 mL dried and distilled oleylamine. Lithium triethylborohydride (1 M in THF, 230 µL) was added to this solution which resulted in a deeply purple solution. Finally, zinc oleate (0.5 M in trioctylphosphine (TOP), 460 µL) was added which resulted in a colorless opaque viscous gel which could be drawn into a syringe.

Oleylamine (15 mL) was added to a 100 mL three neck flask and degassed under vacuum at 110° C. for 30 minutes. Then the mixture was heated to 300° C. under nitrogen flow. Once this temperature was reached, a solution of trioctylphosphine selenide (TOPSe, 2.7 mmol) and diphenylphosphine (225 µL) in TOP (2.9 mL total) was added to the flask. Once the temperature rebounded to 300° C., the TOPTe precursor described above and a solution of diethyl zinc (295 L) in TOP (1 mL) were quickly injected from separate syringes. The temperature was set to 280° C. and after 5 minutes the infusion of a solution of diethylzinc (294 µL) and TOPSe (4.4 mmol) in TOP (3.8 mL total) was started at a rate of 0.5 mL/min until complete addition of the full 3.8 mL. After the precursor infusion was finished the reaction mixture was held at 280° C. for 5 minutes and then cooled to room temperature. The growth solution was diluted with an equal volume of toluene (40 mL), and the nanocrystals were precipitated by addition of ethanol (120 mL). After centrifugation the supernatant was discarded, and the nanocrystals were redispersed in hexane (5 mL). The concentration was measured as the dry weight by evaporating the solvent off an aliquot. The dried material was further subjected to thermogravimetric analysis to determine the ZnSe content.

Example 2

Synthesis of ZnSe Nanocrystals

ZnSe nanocrystals were prepared using the method of Example 1 without the injection of the TOPTe precursor.

Example 3

Synthesis of ZnSe$_{1-x}$Te$_x$/ZnSe Nanocrystals

A ZnSe buffer layer on ZnSe$_{1-x}$Te$_x$ nanocrystals of 4.0 nm average diameter with a target shell thickness of 4 monolayers (ML) ZnSe was prepared.

A 100 mL three neck flask was charged with zinc oleate (6.23 g), lauric acid (3.96 g), trioctylphosphine oxide (4.66 g), and TOP (9.4 mL). The flask was subjected to three vacuum and nitrogen backfill cycles before heating to 100° C. and degassing for 30 minutes. The reaction mixture was placed under a blanket of nitrogen and a solution of ZnSe$_{1-x}$Te$_x$ cores (4.0 mL, 28.0 mg/mL in hexane) mixed with TOPSe (1.8 mL of 0.3 M selenium in TOP) was added to the flask. The flask was evacuated for 2 minutes and then heated to 310° C. under nitrogen flow. Once this temperature was reached, the slow infusion of TOPSe (10.4 mL, 0.3 M in TOP) with a rate of 0.325 mL/min was started. After the selenium infusion was finished, the reaction was held at 310° C. for 10 minutes and then cooled to room temperature. The reaction mixture was diluted with toluene (45 mL). The core/shell nanocrystals were precipitated by addition of ethanol (135 mL) and then isolated by centrifugation, decantation of the supernatant, and redispersion of the nanocrystals in hexane (5 mL). This solution was filtered through a PTFE 0.22 µm syringe filter and the concentration was measured as the dry weight by evaporating the solvent off an aliquot. The dried material was further subjected to thermogravimetric analysis to determine the ZnSe content.

Example 4

Synthesis of ZnSe/ZnS Nanocrystals

A ZnS buffer layer on a ZnSe nanocrystals of 4.0 nm average diameter with a target shell thickness of 4 monolayers (ML) ZnS was prepared.

A 500 mL three neck flask was charged with zinc oleate (27.63 g), lauric acid (17.54 g), trioctylphosphine oxide (18.00 g), and TOP (36.0 mL). The flask was then subjected to three vacuum and nitrogen backfill cycles before heating to 100° C. and degassing for 30 minutes. The reaction mixture was placed under a blanket of nitrogen and a solution of ZnSe cores (2.0 mL, 216.0 mg/mL in hexane) was added to the flask. The flask was evacuated for 2 minutes and then heated to 310° C. under nitrogen flow. Once this temperature was reached, the slow infusion of TOPS (25.3 mL of 2.0 M sulfur in TOP) with a rate of 0.720 mL/min was started. After the sulfur infusion was finished, the reaction was held at 310° C. for 10 minutes and then cooled to room temperature. The reaction mixture was diluted with toluene (95 mL). The core/shell nanocrystals were precipitated by addition of ethanol (190 mL) and then isolated by centrifugation, decantation of the supernatant, and redispersion of the nanocrystals in hexane (7 mL). This solution was filtered through a PTFE 0.22 μm syringe filter and the concentration was measured as the dry weight by evaporating the solvent off an aliquot.

Example 5

Synthesis of $ZnSe_{1-x}Te_x$/ZnSe/ZnS Nanocrystals

A ZnS shell on $ZnSe_{1-x}Te_x$/ZnSe nanocrystals of 6.1 nm average diameter with a target shell thickness of 4 monolayers (ML) ZnS was prepared.

A 25 mL three neck flask was charged with zinc oleate (375 mg), lauric acid (240 mg), trioctylphosphine oxide (281 mg), and TOP (0.566 mL). The flask was then subjected to three vacuum and nitrogen backfill cycles before heating to 100° C. and degassing for 30 minutes. The reaction mixture was placed under a blanket of nitrogen and a solution of $ZnSe_{1-x}Te_x$ cores (0.30 mL, 216.0 mg/mL in hexane) mixed with zinc oleate/TOPS (0.064 ml of 2.0 M sulfur in TOP+ 0.254 ml 0.5 M zinc oleate in TOP) was added to the flask. The flask was evacuated for 2 minutes and then heated to 310° C. under nitrogen flow. Once this temperature was reached, the slow infusion of zinc oleate/TOPS (9.5 mL, 0.3 M in TOP) with a rate of 0.103 mL/min was started. After the sulfur infusion was finished, the reaction was held at 310° C. for 10 minutes and then cooled to room temperature. The reaction mixture was diluted with toluene (5 mL). The core/shell nanocrystals were precipitated by addition of ethanol (10 mL) and then isolated by centrifugation, decantation of the supernatant, and redispersion of the nanocrystals in hexane (5 mL). The precipitation was repeated once with ethanol (10 mL), and the nanocrystals were finally redispersed in octane (3 mL). This solution was filtered through a PTFE 0.22 μm syringe filter and the concentration was adjusted to 18 mg/mL after measuring the dry weight of an aliquot.

Example 6

Synthesis of ZnSe/ZnS Nanocrystals with Hafnium Fluoride Passivation

The procedure is the same as the method outlined in Example 4, except that the flask was also charged with anhydrous hafnium fluoride (242 mg) prior to the initial three vacuum and nitrogen backfill cycles.

Example 7

Synthesis of ZnSe/ZnS Nanocrystals with Zirconium Fluoride Passivation

The procedure is the same as the method outlined in Example 4, except that the flask was also charged with anhydrous zirconium fluoride (159 mg) prior to the initial three vacuum and nitrogen backfill cycles.

Example 8

Synthesis of $ZnSe_{1-x}Te_x$/ZnSe/ZnS Nanocrystals with Hafnium Fluoride Passivation The procedure is the same as the method outlined in Example 5, except that the flask is also charged with anhydrous hafnium fluoride (251 mg) prior to the initial three vacuum and nitrogen backfill cycles.

Example 9

Photoluminescent Properties of Nanocrystals Prepared Using Group IV Fluorides

The solution photoluminescence spectra of the ZnSe/ZnS core/shell and $ZnSe_{1-x}Te_x$/ZnSe/ZnS core/shell/shell quantum dots prepared in the presence of Group IV fluorides are shown in TABLE 1. As shown in TABLE 1, the resultant core/shell(s) quantum dots with a well-passivated surface exhibit high quantum yield (QY) and narrow full width at half-maximum (FWHM).

Figure 3:
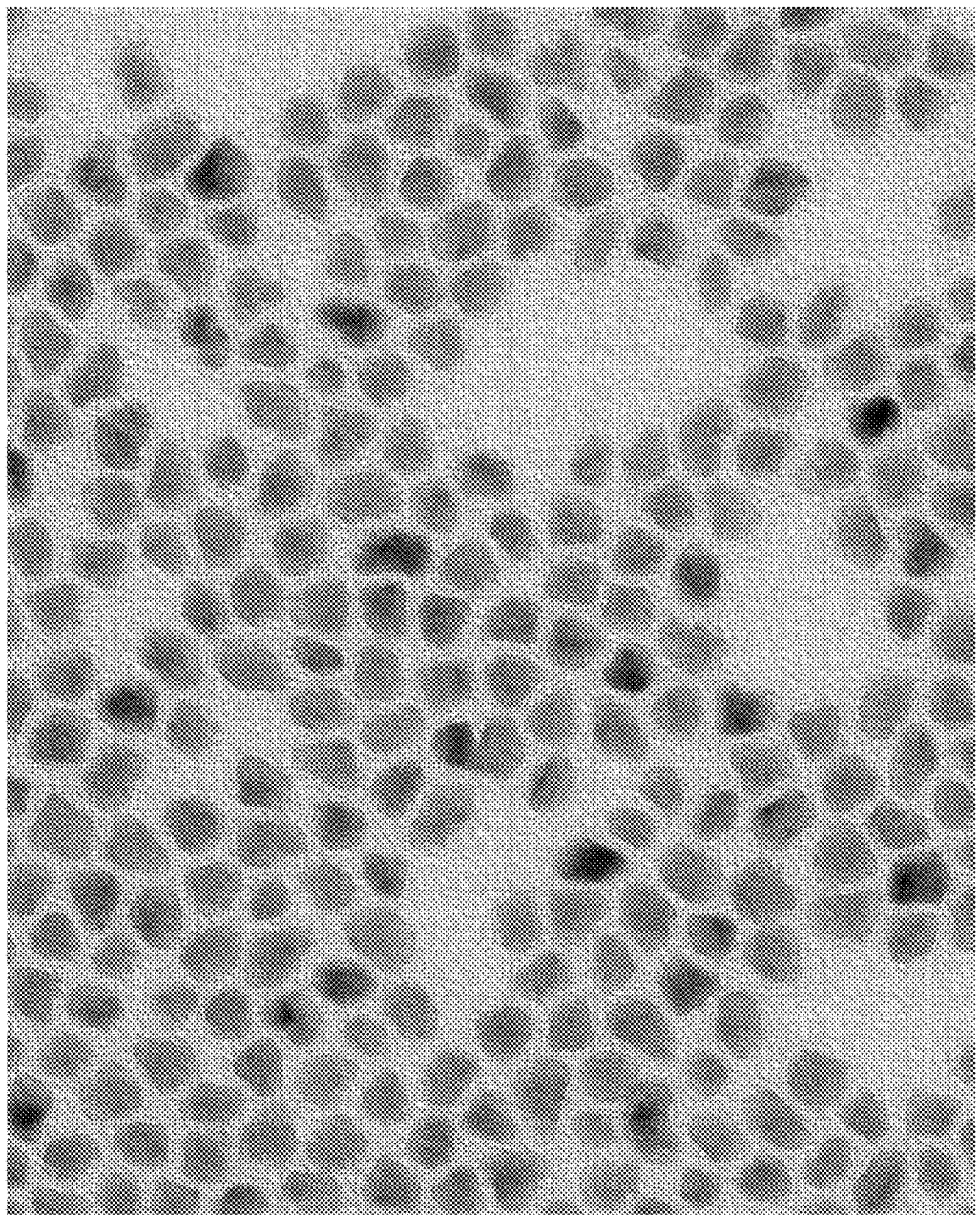
FIG. 3 is a transmission electron microscopy (TEM) image showing the quasi-spherical morphology that is typical of ZnSe/ZnS core/shell structured quantum dots.
Figure 4:
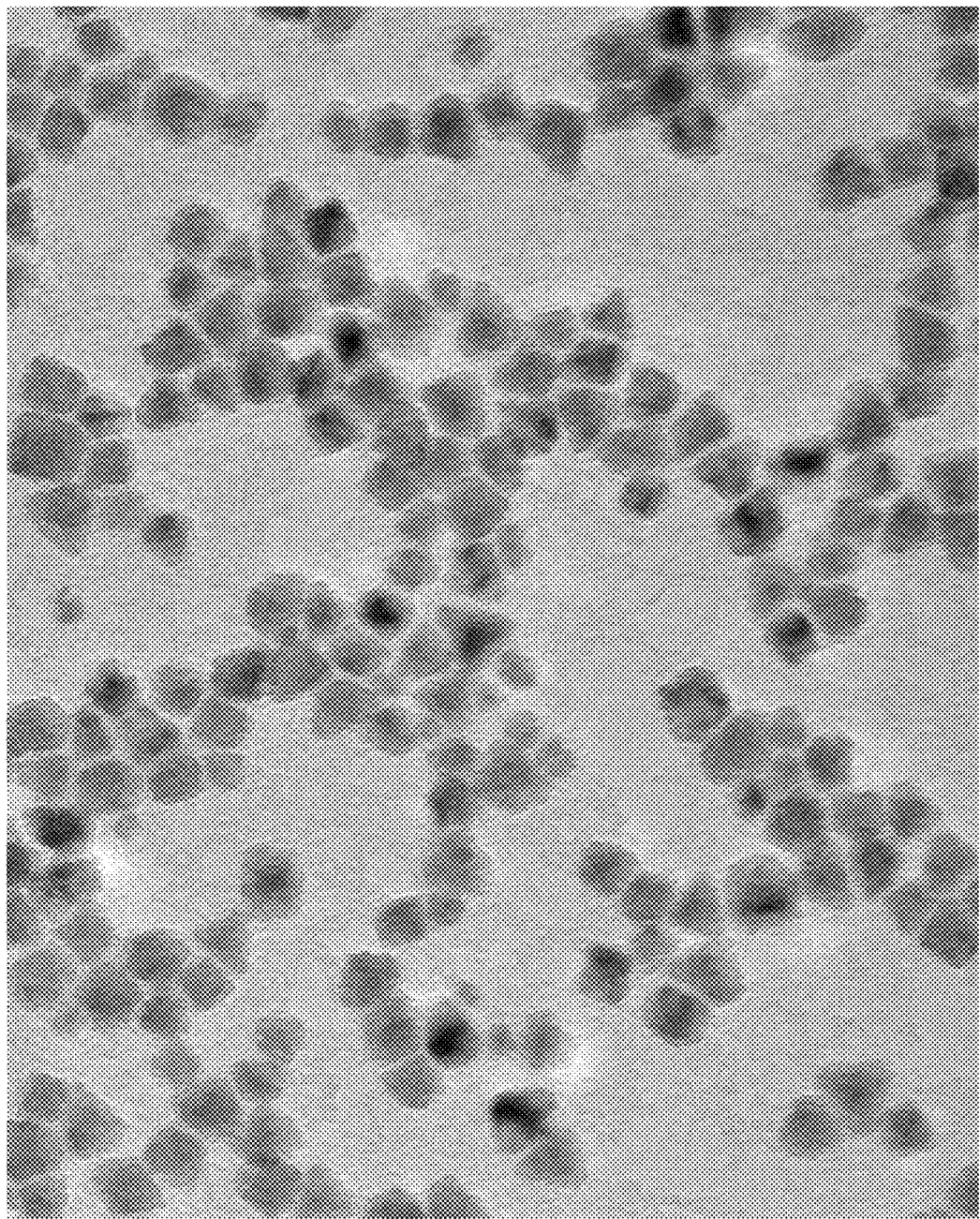
FIG. 4 is a TEM image showing an increased ratio of tetrahedral and cubic particles due to the synthesis of ZnSe/ZnS core/shell structure quantum dots using $HfF_4$.
Figure 5:
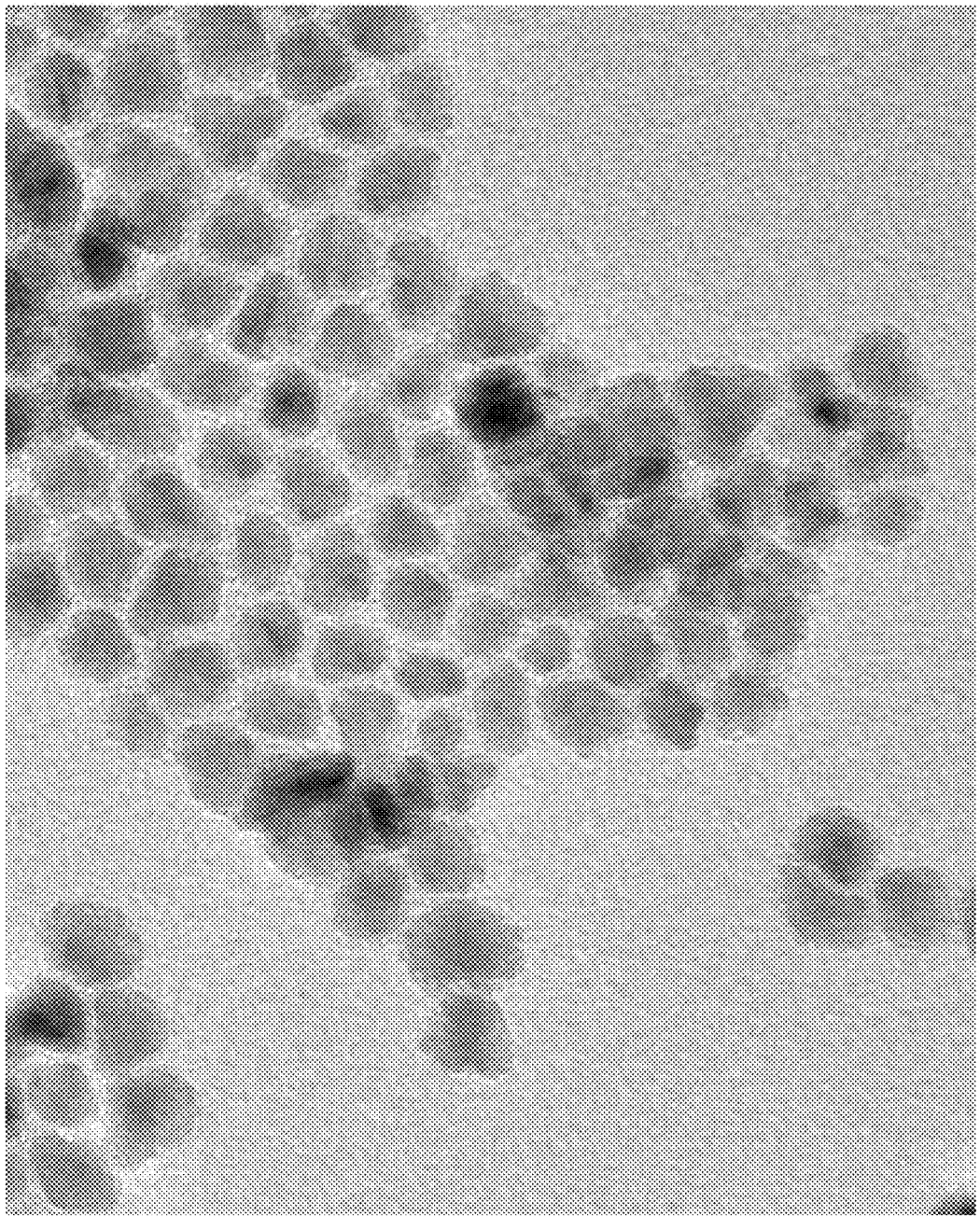
FIG. 5 is a TEM image showing the quasi-spherical morphology that is typical of ZnSeTe/ZnSe/ZnS core/shell/shell structured quantum dots.
Figure 6:
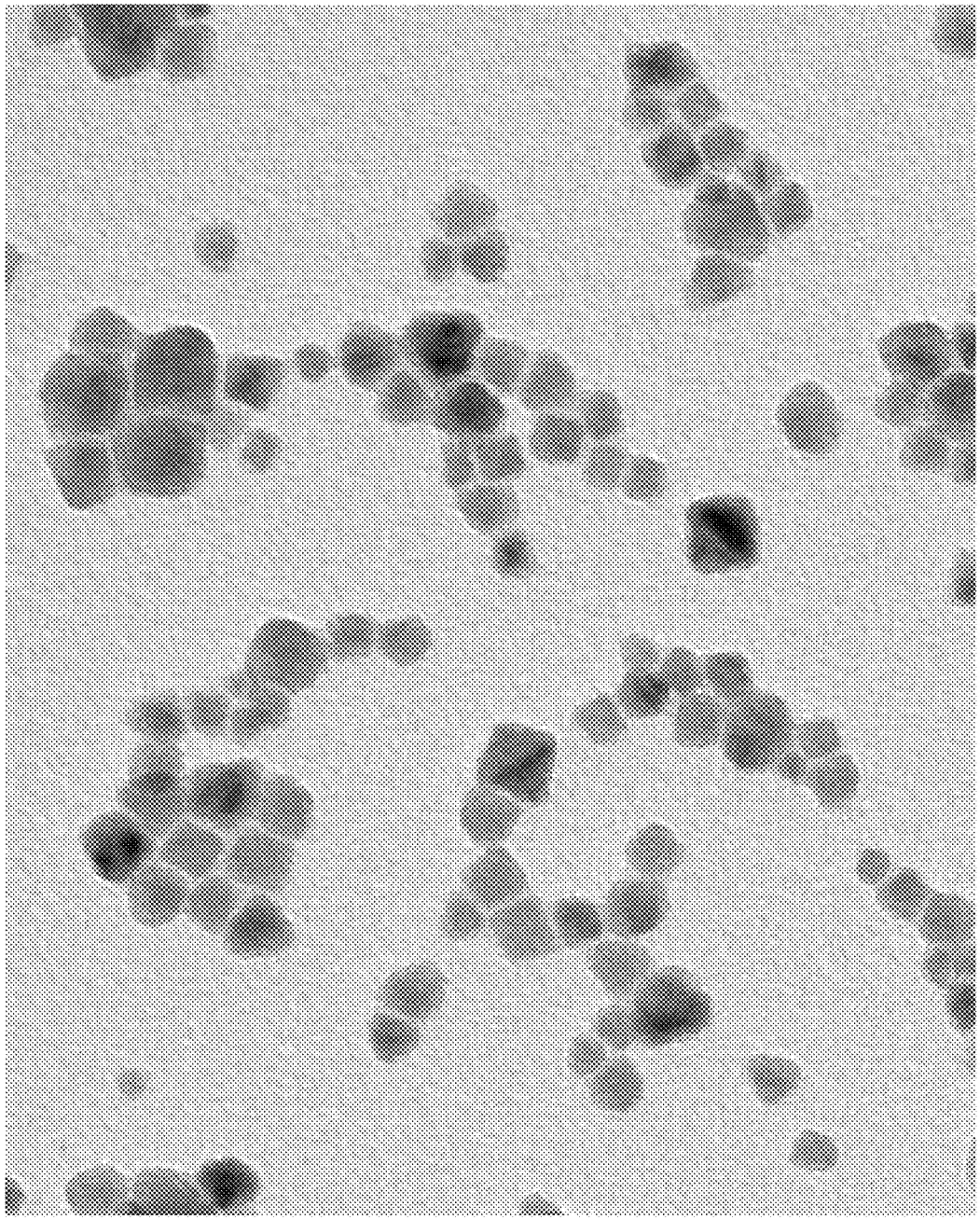
FIG. 6 is a TEM image showing an increased ratio of tetrahedral and cubic particles due to the synthesis of ZnSeTe/ZnSe/ZnS core/shell/shell structured quantum dots using $HfF_4$.

Incorporation of Group IV fluorides during the shell growth also resulted in a change of morphology of the ZnS shelled quantum dots. Instead of the quasi-spherical particles synthesized using standard shell growth conditions (FIG. 3 and FIG. 5), particles with cubic shape were obtained in the presence of $HfF_4$ (FIG. 4 and FIG. 6).

TABLE 1

| Sample | Composition | Method | PWL (nm) | FWHM (nm) | QY (%) |
| --- | --- | --- | --- | --- | --- |
| 1 (Example 4) | ZnSe/ZnS | No fluoride | 433.1 | 14.5 | 79 |
| 2 (Example 6) | ZnSe/ZnS | $HfF_4$ | 431.6 | 14.0 | 78 |
| 3 (Example 5) | $ZnSe_{1-x}Te_x$/ ZnSe/ZnS | No fluoride | 453.5 | 34.5 | 60 |
| 4 (Example 8) | $ZnSe_{1-x}Te_x$/ ZnSe/ZnS | $HfF_4$ | 454.7 | 38.6 | 66 |

Example 10

Electroluminescent Devices Using Nanocrystals Prepared Using Group IV Metal Fluorides Devices were prepared by a combination of spin coating and thermal evaporation. Firstly, the hole injection material poly(3,4-ethylenedioxythiophene):poly(styrene sulfonate) (PEDOT:PSS) (50 nm) was spin coated onto a UV-ozone treated indium tin oxide (ITO) substrate and baked for 15 minutes at 200° C. The devices were transferred to an inert atmosphere and the hole transport material N,N'-di(naphthalen-1-yl)-N,N'-bis(4-vinylphenyl)biphenyl-4,4'-diamine (VNPB) (20 nm) was deposited by spin coating and baked at 200° C. for 15 minutes. A solution of either ZnSe/ZnS or $ZnSe_{1-x}Te_x$/ZnSe/ZnS QDs was deposited by spin coating (with no resin used in the emissive layer), followed by spin coating of the electron transport material ZnMgO (20 nm). An Al cathode (150 nm) was then deposited by thermal evaporation followed by encapsulation of the device using a cap-glass, getter, and epoxy resin.

Figure 7:
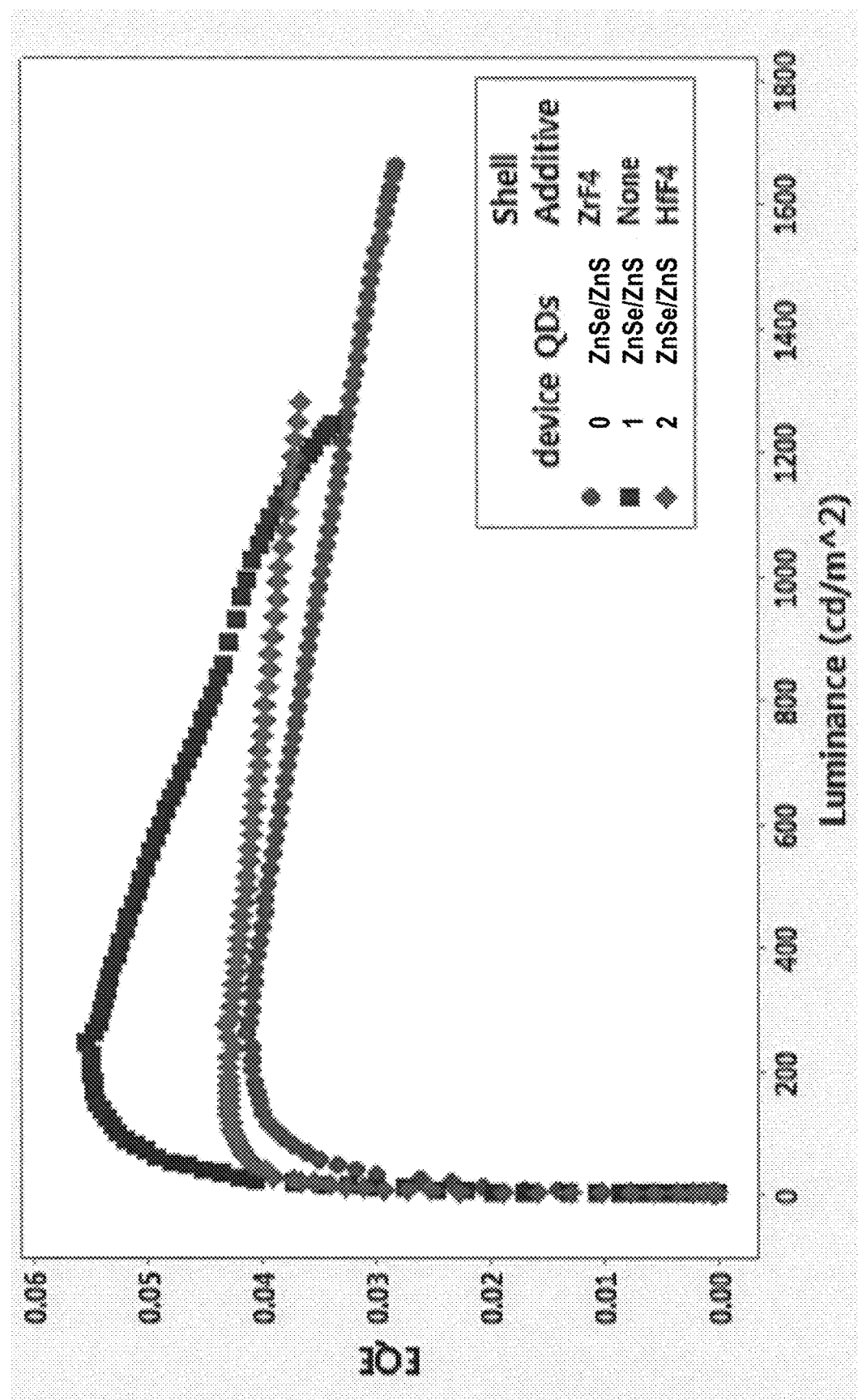
FIG. 7 is a scatter plot of external quantum efficiency versus luminance of devices prepared using quantum dots with standard ligands (■), $ZrF_4$ ligands (●), and $HfF_4$ ligands (♦).

In electrochemical devices, the cubic particles were found to have significantly less roll-off at higher luminescence (FIG. 7). This improved roll-off is indicative of the improved surface passivation and electrochemical stability of the Group IV metal fluoride ligands.

Example 11

Properties of Electroluminescent Devices Prepared

The electroluminescence spectra of devices comprising ZnSe/ZnS core/shell and $ZnSe_{1-x}Te_x$/ZnSe/ZnS core/shell/shell quantum dots prepared in the presence of Group IV metal fluorides are shown in TABLE 2. As shown in TABLE 2, the electroluminescent lifetime (Tso at 500 cd/m²) was increased by a factor of 2-3 in quantum dots prepared in the presence of Group IV metal fluorides.

TABLE 2

| Device | Composition | Method | PWL (nm) | $T_{50}$ at 500 cd/m$_2$ (sec) | Max EQE |
|---|---|---|---|---|---|
| 1 | ZnSe/ZnS | No fluoride | 436 | 7.2 | 5.3 |
| 2 | ZnSe/ZnS | HfF$_4$ | 432 | 25.5 | 4.3 |
| 3 | ZnSe$_{1-x}$Te$_x$/ZnSe/ZnS | No fluoride | 460 | 14.4 | 2.3 |
| 4 | ZnSe$_{1-x}$Te$_x$/ZnSe/ZnS | HfF$_4$ | 456 | 60.6 | 4.0 |

Figure 8:
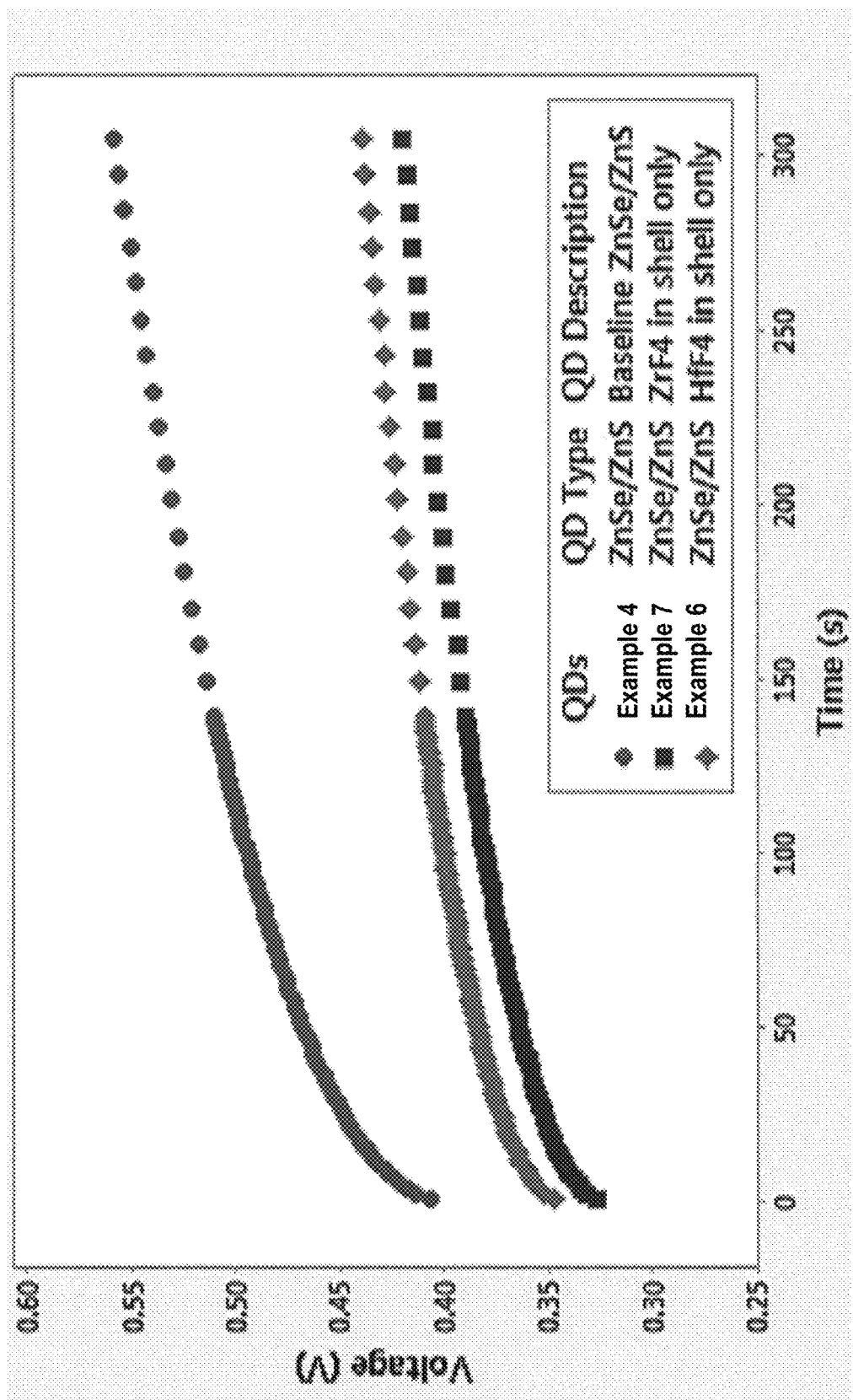
FIG. 8 is a scatter plot of voltage versus time for hole only devices prepared using quantum dots prepared with standard ligands (●), $ZrF_4$ ligands (■), and $HfF_4$ ligands (♦). All devices had an equal quantum dot thickness and were driven at a hole current density of 0.1 J.

Furthermore, evidence of hole trap passivation can be observed in hole-only devices made with Group IV metal fluorides (FIG. 8). Keeping the hole current (0.1 J) and thickness equal, the use of nanostructures prepared with Group IV metal fluorides required a lower (60-80 m V less) voltage to pass the applied current as shown by comparing the output voltage ($V_o$) and forward voltage ($V_r$). Additionally, the voltage rise (dV/dt) was also found to be lower (9-12%) over the course of the test as shown in TABLE 3. This provides direct evidence of enhanced hole conductivity owing to the increase in hole trap passivation.

TABLE 3

| Device | Composition | Method | Vo (V) | Vf (V) | dV/dt (%) |
|---|---|---|---|---|---|
| 5 | ZnSe/ZnS | No fluoride | 0.406 | 0.558 | 37.43842 |
| 6 | ZnSe/ZnS | ZrF$_4$ (in shell only) | 0.326 | 0.419 | 28.52761 |
| 7 | ZnSe/ZnS | HfF$_4$ (in shell only) | 0.347 | 0.438 | 26.22478 |

While various embodiments have been described above, it should be understood that they have been presented by way of example only, and not limitation. It will be apparent to persons skilled in the relevant art that various changes in form and detail can be made therein without departing from the spirit and scope of the invention. Thus, the breadth and scope should not be limited by any of the above-described exemplary embodiments, but should be defined only in accordance with the following claims and their equivalents.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A nanostructure comprising a nanocrystal core and at least one shell, wherein the shell is disposed on the core or on a previously deposited shell of a same or a different composition as the shell, and wherein at least one shell comprises at least one metal fluoride of formula (I):

MF$_4$          (I)

wherein:
M=Zr, Hf, or Ti.

2. The nanostructure of claim 1, wherein the core comprises ZnSe or ZnSe$_{1-x}$Te$_x$, wherein 0≤x≤1.

3. The nanostructure of claim 1, wherein at least one shell comprises a ZnS shell, and the metal fluoride is located in the ZnS shell.

4. The nanostructure of claim 1, wherein the at least one metal fluoride is HfF$_4$ or ZrF$_4$.

5. The nanostructure of claim 1, wherein the molar ratio of at least one metal fluoride to zinc in the nanostructure is from about 1:1 to about 1:8.

6. The nanostructure of claim 1, wherein the nanostructure comprises:
   (a) a core comprising ZnSe, at least one shell comprising ZnS, and at least one shell comprising HfF$_4$; or
   (b) a core comprising ZnSe$_{1-x}$Te$_x$, wherein 0≤x≤1, at least one shell comprising ZnSe, and at least one shell comprising ZnS, and at least one shell comprising HfF$_4$.

7. The nanostructure of claim 1, wherein the nanostructure is a quantum dot.

8. The nanostructure of claim 1, wherein the nanostructure exhibits a photoluminescence quantum yield of between about 60% and about 100%.

9. The nanostructure of claim 1, wherein the nanostructure exhibits a full width at half-maximum of between about 10 nm and about 40 nm.

10. A nanostructure composition comprising:
    (a) the nanostructure of claim 1; and
    (b) at least one organic resin.

11. An illumination device comprising:
    (a) a first conductive layer;
    (b) a second conductive layer; and
    (c) an emitting layer disposed between the first conductive layer and the second conductive layer, wherein the emitting layer comprises at least one population of nanostructures comprising a core and at least one shell, wherein at least one shell comprises a Group IV metal fluoride.

12. The illumination device of claim 11, wherein the core of the nanostructures comprises ZnSe or ZnSe$_{1-x}$Te$_x$, wherein 0≤x<1.

13. The illumination device of claim 11, further comprising a semiconductor polymer layer.

14. The illumination device of claim 13, wherein the semiconductor polymer layer comprises poly(3,4-ethylenedioxythiophene)/polystyrene sulfonate (PEDOT/PSS).

15. The illumination device of claim 11, further comprising a first transport layer.

16. The illumination device of claim 15, wherein the first transport layer comprises N,N'-di(naphthalen-1-yl)-N,N'-bis(4-vinylphenyl)-4,4'-diamine.

* * * * *